US012628345B2

(12) United States Patent
Lee et al.

(10) Patent No.: US 12,628,345 B2
(45) Date of Patent: May 12, 2026

(54) METHOD FOR FABRICATING THE SEMICONDUCTOR MEMORY DEVICE

(71) Applicant: SK hynix Inc., Icheon-si (KR)

(72) Inventors: Yu Jeong Lee, Icheon-si (KR); Dae Hwan Yun, Icheon-si (KR); Gil Bok Choi, Icheon-si (KR)

(73) Assignee: SK hynix Inc., Icheon (KR)

( * ) Notice: Subject to any disclaimer, the term of this patent is extended or adjusted under 35 U.S.C. 154(b) by 7 days.

(21) Appl. No.: 18/438,894

(22) Filed: Feb. 12, 2024

(65) Prior Publication Data

US 2024/0188298 A1 Jun. 6, 2024

Related U.S. Application Data

(63) Continuation of application No. 17/362,624, filed on Jun. 29, 2021, now Pat. No. 11,903,200.

(30) Foreign Application Priority Data

Feb. 9, 2021 (KR) ........................ 10-2021-0018105

(51) Int. Cl.
H10B 43/27 (2023.01)
H01L 21/02 (2006.01)
(Continued)

(52) U.S. Cl.
CPC ....... H10B 43/27 (2023.02); H01L 21/02164 (2013.01); H01L 21/02238 (2013.01);
(Continued)

(58) Field of Classification Search
CPC ........ H10B 43/27; H10B 41/27; H10B 41/35; H10B 43/35; H10B 43/40;
(Continued)

(56) References Cited

U.S. PATENT DOCUMENTS 9,613,979 B2 4/2017 Iinuma et al.
9,754,961 B2* 9/2017 Yamasaki .............. H10D 62/40
(Continued)

FOREIGN PATENT DOCUMENTS

KR 1020050068491 A 7/2005
KR 1020120121746 A 11/2012
(Continued)

OTHER PUBLICATIONS

I.-W. Wu et al., Retardation of nucleation rate for grain size enhancement by deep silicon ion implantation of low-pressure chemical vapor deposited amorphous silicon films, Journal of Applied Physics, vol. 65, Issue 10, pp. 4036-4039 Jun. 4, 1998, https://doi.org/10.1063/1.343327.
(Continued)

*Primary Examiner* — David Vu
(74) *Attorney, Agent, or Firm* — WILLIAM PARK AND ASSOCIATES LTD.

(57) ABSTRACT

A method for fabricating a semiconductor memory device may include the steps of: forming a stacked body on a source layer by alternately stacking a plurality of interlayer dielectric layers and a plurality of gate sacrificial layers; forming a plurality of channel holes through the stacked body, the channel holes each having a lower end extended into the source layer; forming a channel layer along the surfaces of the channel holes, the channel layer including a first region formed in the stacked body and a second region formed in the source layer; and forming a channel passivation layer in the first region to scale down the thickness of the channel layer of the first region.

19 Claims, 29 Drawing Sheets

(51) Int. Cl.

| | |
|---|---|
| *H01L 23/31* | (2006.01) |
| *H10B 41/27* | (2023.01) |
| *H10D 62/40* | (2025.01) |
| *H10D 62/83* | (2025.01) |

(52) U.S. Cl.
CPC .. *H01L 21/02532* (2013.01); *H01L 21/02592* (2013.01); *H01L 21/02667* (2013.01); *H01L 23/3171* (2013.01); *H10D 62/40* (2025.01); *H10D 62/83* (2025.01)

(58) Field of Classification Search
CPC ......... H01L 21/02164; H01L 21/02238; H01L 21/02532; H01L 21/02592; H01L 21/02667; H01L 23/3171; H10D 62/40; H10D 62/83
See application file for complete search history.

(56) References Cited

U.S. PATENT DOCUMENTS

| | | | |
|---|---|---|---|
| 9,799,657 | B2 | 10/2017 | Noh et al. |
| 10,186,521 | B2 | 1/2019 | Fukumoto et al. |

| | | | |
|---|---|---|---|
| 2017/0018567 | A1 | 1/2017 | Iinuma |
| 2017/0077125 | A1 | 3/2017 | Yamasaki et al. |
| 2017/0162578 | A1 | 6/2017 | Noh et al. |
| 2017/0207226 | A1 | 7/2017 | Lee |
| 2018/0366483 | A1 | 12/2018 | Choi |
| 2020/0013791 | A1 | 1/2020 | Or-Bach et al. |

FOREIGN PATENT DOCUMENTS

| | | |
|---|---|---|
| KR | 1020170127785 A | 11/2017 |
| KR | 1020170139331 A | 12/2017 |
| KR | 1020180121738 A | 11/2018 |
| KR | 1020190123050 A | 10/2019 |

OTHER PUBLICATIONS

R. Kakkad et al., Enhancement of Solid-phase Crystallization Kinetics of Amorphous Silicon by Annealing in a High-pressure H2O Ambient, Journal of the Korean Physical Society, vol. 55, No. 1, Jul. 2009.

\* cited by examiner

Figure 12:
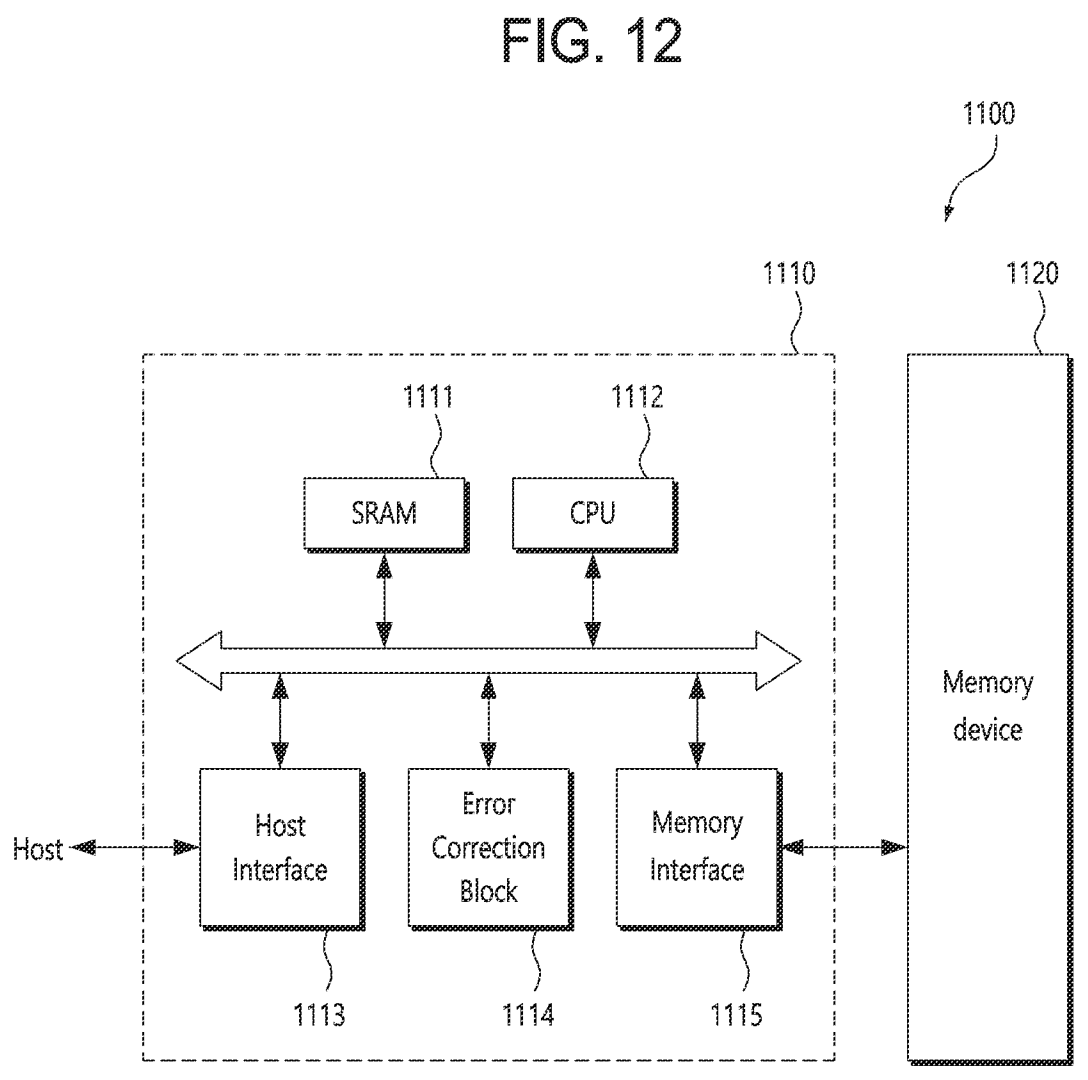

Memory
device

1110

1112

CPU

1111

SRAM

1115

Memory
Interface

1114

Error
Correction
Block

1113

Host
Interface

Host

METHOD FOR FABRICATING THE SEMICONDUCTOR MEMORY DEVICE

CROSS-REFERENCES TO RELATED APPLICATION

The present application is a continuation of U.S. patent application Ser. No. 17/362,624, filed on Jun. 29, 2021, titled "Semiconductor memory device and method for fabricating the semiconductor memory device" and claims priority under 35 U.S.C. § 119(a) to Korean application number 10-2021-0018105, filed on Feb. 9, 2021, in the Korean Intellectual Property Office, which is incorporated herein by reference in their entirety.

BACKGROUND

1. Technical Field

Various embodiments generally relate to an electronic device, and more particularly, to a semiconductor memory device and a method for fabricating the semiconductor memory device.

2. Related Art

In order to satisfy excellent performance and a low price, which are demanded by consumers, the degree of integration of a semiconductor device needs to be improved. In particular, since the degree of integration of the semiconductor memory device is an important factor to decide the performance and price of a product, various attempts are being made to improve the degree of integration. For example, research is being actively conducted on a 3D semiconductor memory device which includes a plurality of memory cells arranged in a 3D manner, and thus may reduce an area occupied by memory cells per unit area of a substrate.

SUMMARY

In an embodiment, a method for fabricating a semiconductor memory device may include the steps of: forming a stacked body on a source layer by alternately stacking a plurality of interlayer dielectric layers and a plurality of gate sacrificial layers; forming a plurality of channel holes through the stacked body, the channel holes each having a lower end extended into the source layer; forming a channel layer along the surfaces of the channel holes, the channel layer including a first region formed in the stacked body and a second region formed in the source layer; and forming a channel passivation layer in the first region to scale down the thickness of the channel layer of the first region.

BRIEF DESCRIPTION OF THE DRAWINGS

FIG. 3 is a perspective view schematically illustrating the semiconductor memory device in accordance with an embodiment.

FIG. 12 is a block diagram illustrating a configuration of a memory system in accordance with an embodiment.

DETAILED DESCRIPTION

Figure 1:
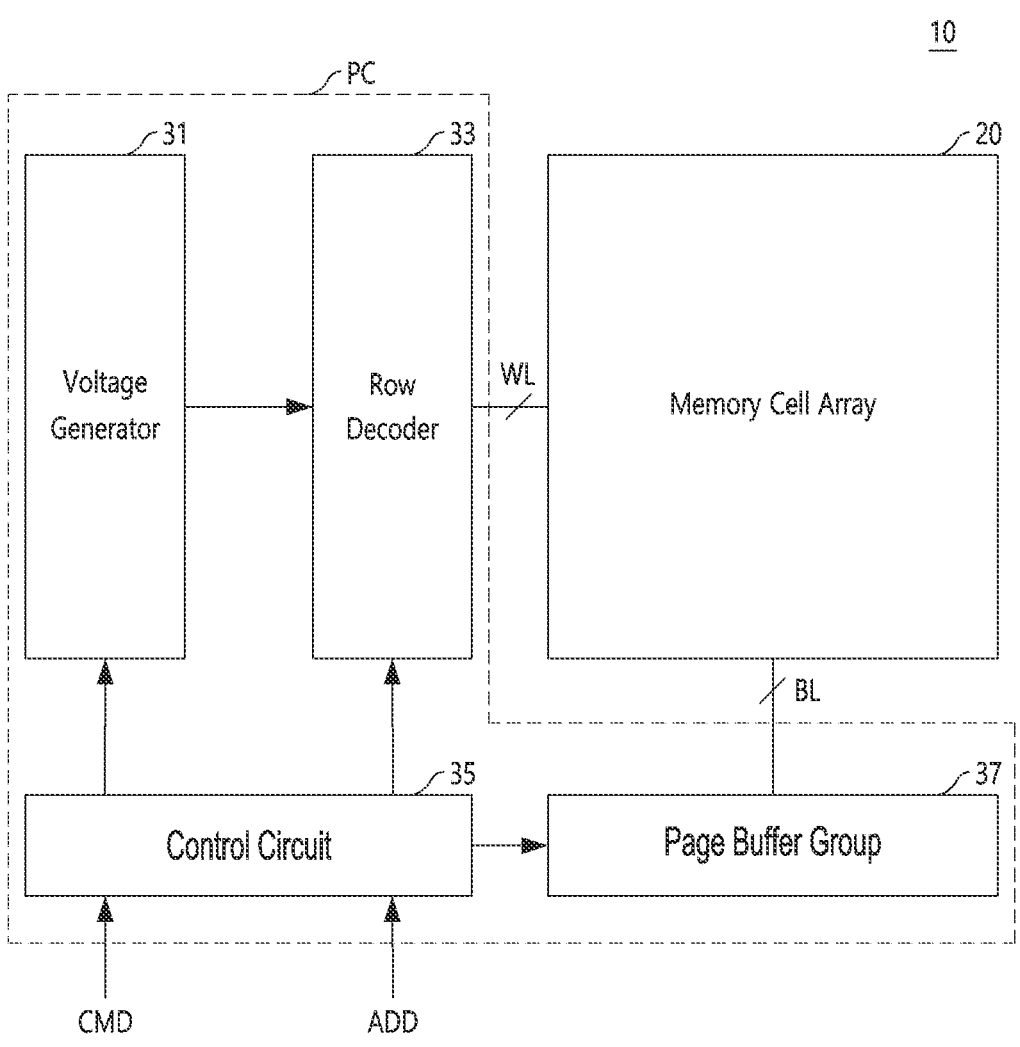
FIG. 1 is a block diagram schematically illustrating a configuration of a semiconductor memory device in accordance with an embodiment.

Various embodiments are directed to a semiconductor memory device capable of improving operation reliability, and a method for fabricating the semiconductor memory device.

The advantages and characteristics of the disclosure and a method for achieving the advantages and characteristics will become clear through the embodiments described in detail with reference to the accompanying drawings. However, the disclosure is not limited to the embodiments disclosed below and may be embodied in different forms. These embodiments are provided so that this disclosure will be thorough and complete, and the scope of the disclosure will be fully conveyed to those skilled in the art. The disclosure is only defined by the scope of claims. In the drawings, the sizes and relative sizes of layers and regions may be exaggerated in order to clarify the description. Through the specification, like reference numerals represent the same components.

The embodiments which will be described below provide a semiconductor memory device capable of improving operation reliability, and a method for fabricating the same. The semiconductor memory device may include a nonvolatile semiconductor memory device having a 3D structure, for example, a 3D NAND memory device.

The semiconductor memory device in accordance with an embodiment may improve operation reliability through channel crystallization. More specifically, as the technology of the semiconductor memory device has evolved into a method for stacking memory cells, a channel also has a 3D structure extended in a vertical direction. Monocrystalline silicon which is a typically used channel material has a limitation in forming a 3D channel extended in a vertical direction. Thus, much attention is being paid to polycrystalline silicon which may improve process speed. Since monocrystalline silicon includes silicon atoms which are regularly arranged and thus have no defects therein, monocrystalline silicon exhibits an excellent electrical characteristic. On the other hand, polycrystalline silicon has a structure in which silicon lumps having different lattice directions, i.e., a plurality of grains and a grain boundary, are connected. In polycrystalline silicon, the grain boundary not only serves as a barrier to disturb charge transfer and a defect to capture charge, but also serves as a source to cause a surface defect such as a pinhole. Thus, the grain boundary may degrade the characteristics of memory cells.

Therefore, the embodiments which will be described below provide a semiconductor memory device which may improve operation reliability because the sizes of grains of polycrystalline silicon used as a channel are increased to reduce an area occupied by a grain boundary per unit volume or the number of grain boundaries per unit area, and a method for fabricating the same.

Hereafter, a semiconductor memory device in accordance with an embodiment will be described in detail with reference to the drawings. In the following descriptions, a first direction D1, a second direction D2 and a third direction D3 may indicate directions crossing one another. For example, the first direction D1, the second direction D2 and the third direction D3 in the XYZ coordinate system may indicate an X-axis direction, a Y-axis direction and a Z-axis direction, respectively.

FIG. 1 is a block diagram schematically illustrating a configuration of a semiconductor memory device in accordance with an embodiment.

As illustrated in FIG. 1, the semiconductor memory device 10 may include a peripheral circuit PC and a memory cell array 20.

The peripheral circuit PC may be configured to control a program operation for storing data in the memory cell array 20, a read operation for outputting data stored in the memory cell array 20, and an erase operation for erasing data stored in the memory cell array 20. For example, the peripheral circuit PC may include a voltage generator 31, a row decoder 33, a control circuit 35 and a page buffer group 37.

The memory cell array 20 may include a plurality of memory blocks. The memory cell array 20 may be coupled to the row decoder 33 through word lines WL, and coupled to the page buffer group 37 through bit lines BL.

The control circuit 35 may control the peripheral circuit PC in response to a command CMD and an address ADD.

The voltage generator 31 may generate various operating voltages, such as a pre-erase voltage, an erase voltage, a ground voltage, a program voltage, a verification voltage, a pass voltage and a read voltage, which are used for a program operation, a read operation and an erase operation in response to control of the control circuit 35.

The row decoder 33 may select a memory block in response to control of the control circuit 35. The row decoder 33 may be configured to apply operation voltages to the word lines WL coupled to the selected memory block.

The page buffer group 37 may be coupled to the memory cell array 20 through the bit lines BL. The page buffer group 37 may temporarily store data received from an input/output circuit (not illustrated) during a program operation, in response to control of the control circuit 35. The page buffer group 37 may sense the voltages or currents of the bit lines BL during a read operation or a verification operation, in response to control of the control circuit 35. The page buffer group 37 may select the bit lines BL in response to control of the control circuit 35.

Specifically, the memory cell array 20 may be disposed in parallel to the peripheral circuit PC, or overlap a part of the peripheral circuit PC.

Figure 2:
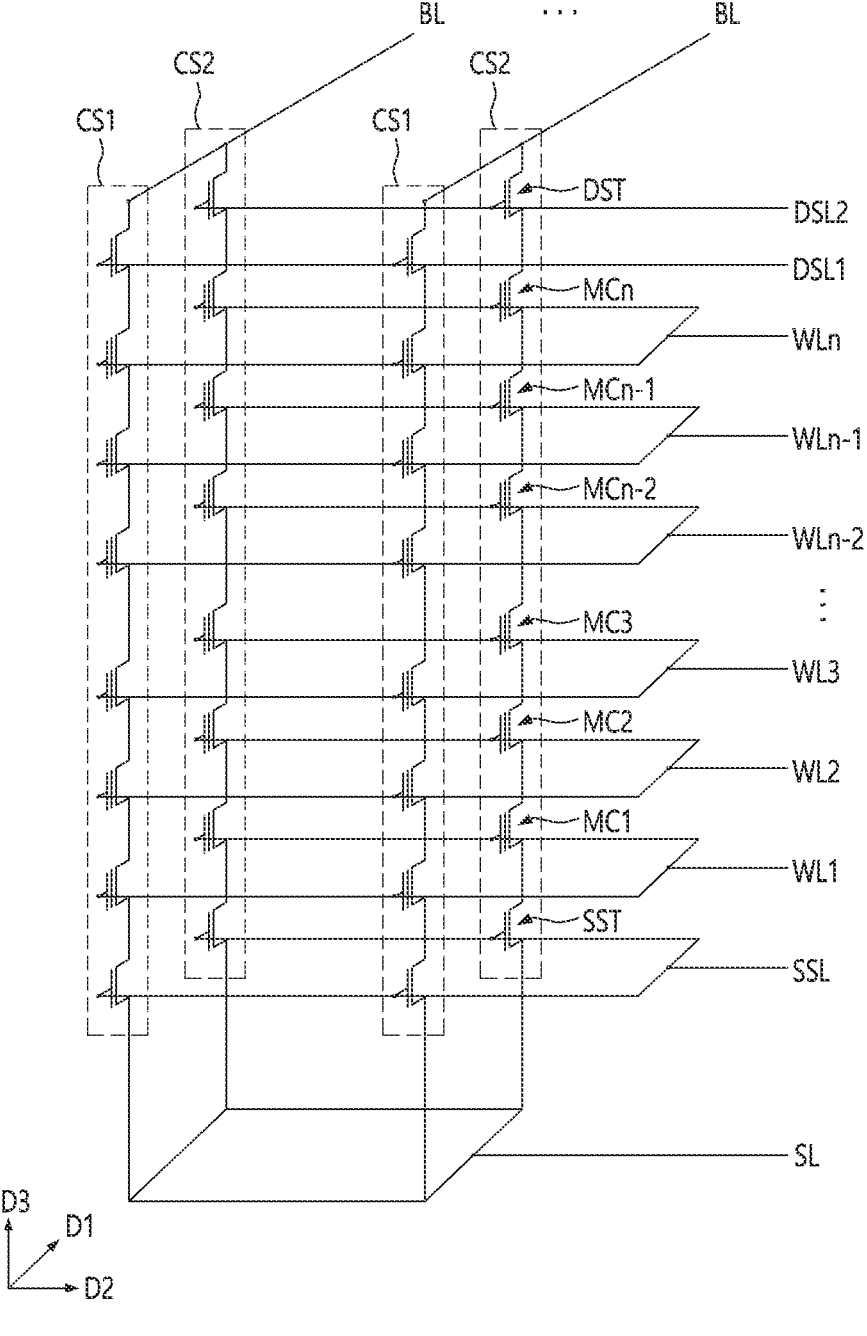
FIG. 2 is a circuit diagram illustrating a part of a memory block of the semiconductor memory device in accordance with an embodiment.

FIG. 2 is a circuit diagram illustrating a part of a memory block of the semiconductor memory device in accordance with an embodiment.

As illustrated in FIG. 2, the memory block may include a source layer SL and a plurality of cell strings CS1 and CS2 coupled to a plurality of word lines WL1 to WLn (where n is a positive integer) in common. The plurality of cell strings CS1 and CS2 may be coupled to a plurality of bit lines BL.

Each of the cell strings CS1 and CS2 may include one or more source selection transistors SST coupled to the source layer SL, one or more drain selection transistors DST coupled to a bit line BL, and a plurality of memory cells MC1 to MCn coupled in series between the source selection transistor SST and the drain selection transistor DST.

The gates of the plurality of memory cells MC1 to MCn may be coupled to the respective word lines WL1 to WLn which are stacked so as to be spaced apart from each other. The plurality of word lines WL1 to WLn may be arranged between a source selection line SSL and two or more drain selection lines DSL1 and DSL2. The two or more drain selection lines DSL1 and DSL2 may be spaced apart from each other at the same level.

The source selection transistor SST may have a gate coupled to the source selection line SSL. The drain selection transistor DST may have a gate coupled to a drain selection line corresponding to the gate of the drain selection transistor DST.

The source layer SL may be coupled to a source of the source selection transistor SST. The drain selection transistor DST may have a drain coupled to a bit line BL corresponding to the drain of the drain selection transistor DST.

The plurality of cell strings CS1 and CS2 may be divided into string groups coupled to the two or more drain selection lines DSL1 and DSL2, respectively. Cell strings coupled to the same word line and the same bit line may be independently controlled by different drain selection lines. Furthermore, cell strings coupled to the same drain selection line may be independently controlled by different bit lines. For example, the two or more drain selection lines DSL1 and DSL2 may include a first drain selection line DSL1 and a second drain selection line DSL2. The plurality of cell strings CS1 and CS2 may include a first cell string CS1 of a first string group coupled to the first drain selection line DSL1 and a second cell string CS2 of a second string group coupled to the second drain selection line DSL2.

Figure 3:
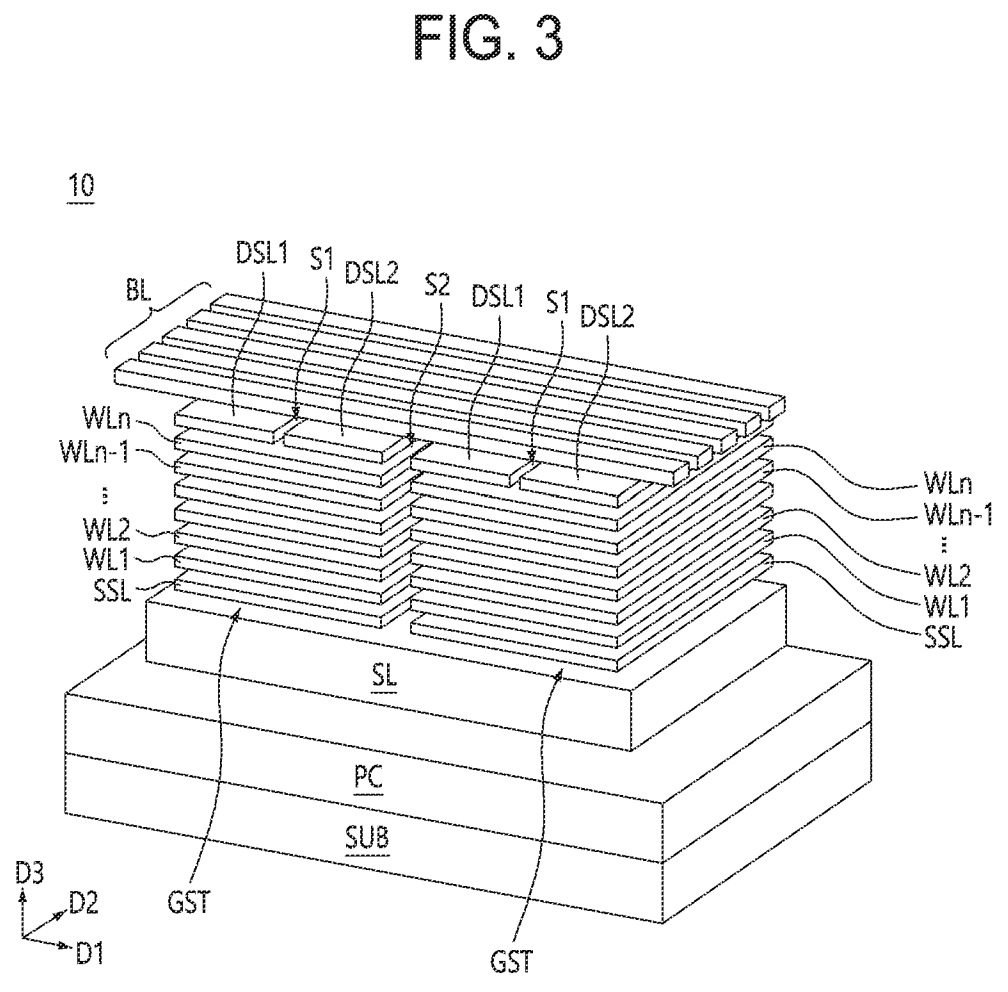

FIG. 3 is a perspective view schematically illustrating the semiconductor memory device in accordance with an embodiment.

As illustrated in FIG. 3, the semiconductor memory device 10 may include a peripheral circuit PC disposed on a substrate SUB and gate stacks GST overlapping the peripheral circuit PC.

Each of the gate stacks GST may include a source selection line SSL, a plurality of word lines WL1 to WLn, and two or more drain selection lines DSL1 and DSL2 which are isolated from each other at the same level by a first slit S1.

The source selection line SSL and the plurality of word lines WL1 to WLn may be expanded in the first and second directions D1 and D2, and formed in a plate shape parallel to the top surface of the substrate SUB.

The plurality of word lines WL1 to WLn may be stacked in the third direction D3 so as to be spaced apart from each other, and may be disposed between the source selection line SSL and two or more drain selection lines DSL1 and DSL2.

The gate stacks GST may be isolated from each other by a second slit S2, wherein the first slit S1 may be formed to be shorter than the second slit S2 in the third direction D3, and overlap the plurality of word lines WL1 to WLn.

Each of the first and second slits S1 and S2 may be extended in a straight line shape, zigzag shape or wave shape in the second direction. Further, each of the first and second slits S1 and S2 may have a width which is changed to various values according to the design rules.

The source selection line SSL may be disposed closer to the peripheral circuit PC than the two or more drain selection lines DSL1 and DSL2. The semiconductor memory device 10 may include a source layer SL disposed between the gate stacks GST and the peripheral circuit PC and a plurality of bit lines BL separated farther from the peripheral circuit PC than the source layer SL. The gate stacks GST may be disposed between the plurality of bit lines BL and the source layer SL.

The plurality of bit lines BL may be formed of various conductive materials, for example, a doped semiconductor layer, a metal layer and a metal alloy layer. The source layer SL may include a doped semiconductor layer. For example, the source layer SL may include an n-type doped silicon layer.

Although not illustrated, the peripheral circuit PC may be electrically coupled to the plurality of bit lines BL, the source layer SL and the plurality of word lines WL1 to WLn through interconnections having various structures.

Figure 4:
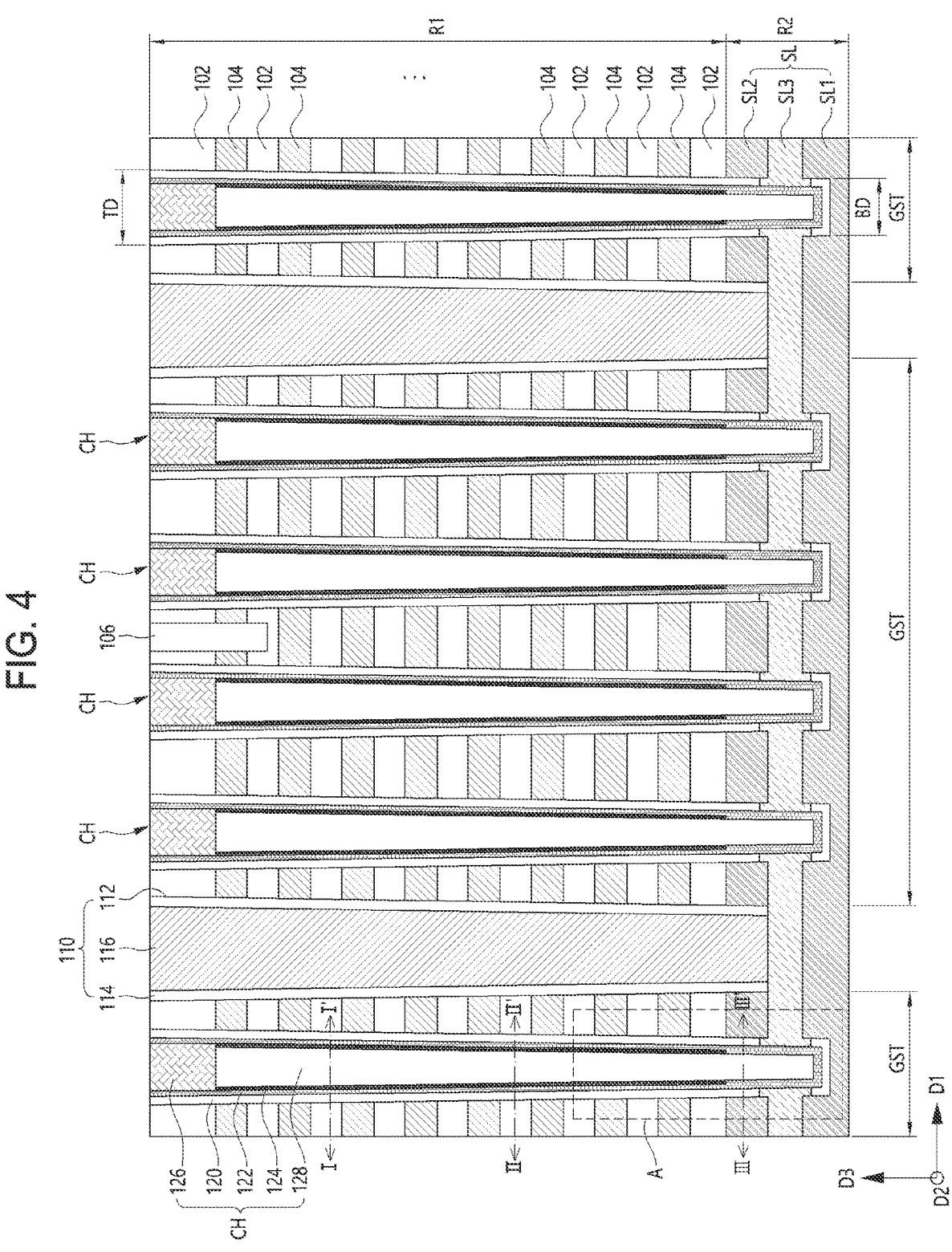
FIG. 4 is a perspective view illustrating the semiconductor memory device in accordance with an embodiment.
Figure 5:
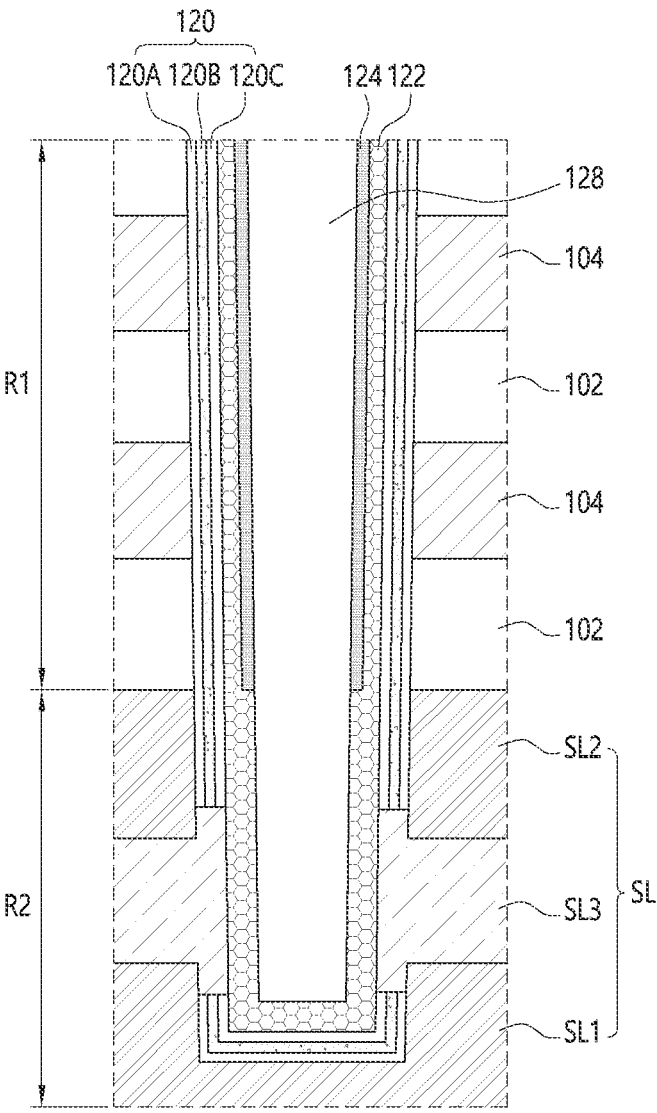
FIG. 5 is an expanded cross-sectional view of a region 'A' illustrated in FIG. 4.

As illustrated in FIGS. 4 and 5, the semiconductor memory device in accordance with an embodiment may include the source layer SL, the plurality of gate stacks GST formed on the source layer SL, slit structures 110 formed between the respective gate stacks GST, and a plurality of channel structures CH formed through the gate stacks GST.

The source layer SL may overlap the gate stacks GST, and have a plate shape extended in the first and second directions D1 and D2. The source layer SL may have a structure in which a first source layer SL1, a third source layer SL3 and a second source layer SL2 are sequentially stacked. That is, the source layer SL may have a structure in which the third source layer SL3 is inserted between the first source layer SL1 and the second source layer SL2. The third source layer SL3 may be electrically coupled to a channel layer 122 of each of the channel structures CH.

Each of the first to third source layers SL1 to SL3 may include a doped semiconductor layer. For example, each of the first to third source layers SL1 to SL3 may include an n-type doped silicon layer. Accordingly, the first and second source layers SL1 and SL2 may each have a higher impurity concentration than the third source layer SL3 inserted therebetween.

In an embodiment, the case in which the first to third source layers SL1 to SL3 are formed of the same conductive material is taken as an example. However, the embodiment is not limited thereto. In a modified example, the first and second source layers SL1 and SL2 may be formed of the same conductive material, and the third source layer SL3 inserted therebetween may be formed of a different conductive material from the first and second source layers SL1 and SL2. In another modified example, the first to third source layers SL1 to SL3 may be formed of different materials from one another.

The gate stacks GST may be isolated by the plurality of slit structures 110. Specifically, the slit structures 110 may be located on both sidewalls of each of the gate stacks GST, respectively, in the first direction D1. The gate stacks GST isolated by the slit structures 110 may correspond to one memory block. The source layer SL may be located at the bottoms of the gate stacks GST, and a plurality of bit lines (not illustrated, see FIG. 3) may be located at the tops of the gate stacks GST. Therefore, as illustrated in FIG. 3, the source layer SL, the gate stacks GST and the plurality of bit lines overlap one another.

In an embodiment, as illustrated in FIG. 3, the case in which the source layer SL is located at the bottoms of the gate stacks GST and the bit lines are located at the tops of the gate stacks GST is taken as an example. However, the embodiment is not limited thereto. In a modified example, the bit lines may be located at the bottoms of the gate stacks GST, and the source layer SL may be located at the tops of the gate stacks GST.

Each of the slit structures 110 may correspond to the second slit S2 illustrated in FIG. 3. Each of the slit structures 110 may be a line-type pattern extended in the second direction D2. At this time, each of the slit structures 110 may be extended in a straight line shape, zigzag shape or wave shape in the second direction D2. Lower ends of the slit structures 110 in the third direction D3 may be expanded into the source layer SL. For example, as illustrated in FIG. 4, the bottom surface of the slit structure 110 may abut on the third source layer SL3 inserted between the first and second source layers SL1 and SL2.

Each of the slit structures 110 may include a line-type slit trench 112 extended in the second direction D2, a slit spacer 114 formed on either sidewall of the slit trench in the first direction D1, and a slit layer 116 gap-filling the slit trench 112, as shown in FIG. 4. The slit spacer 114 may include a dielectric material, and the slit layer 116 may include a conductive material.

In the present embodiment, the case in which the slit layer 116 includes a conductive material is taken as an example. However, the embodiment is not limited thereto. In a modified example, the slit layer 116 may include a dielectric material.

As illustrated in FIG. 4, each of the gate stacks GST may be a stacked structure in which a plurality of interlayer dielectric layers 102 and a plurality of gate conductive layers 104 are alternately stacked. At each of the lowermost layer and the uppermost layer of the gate stack GST, the interlayer dielectric layer 102 may be located. The interlayer dielectric layer 102 located at the uppermost layer of the gate stack GST may have a larger thickness than the other interlayer dielectric layers 102. Each of the interlayer dielectric layer 102 and the gate conductive layer 104 may have a plate shape extended in the first and second directions D1 and D2.

The interlayer dielectric layer 102 may include any one dielectric layer selected from the group consisting of an oxide layer, a nitride layer and an oxynitride layer. For example, the interlayer dielectric layer 102 may include an oxide layer. The gate conductive layer 104 may include a metal-containing conductive layer. For example, the gate conductive layer 104 may include a tungsten layer. For another example, the gate conductive layer 104 may include a stacked layer in which a titanium nitride layer and a tungsten layer are stacked. The titanium nitride layer may serve as a barrier layer to prevent diffusion of tungsten.

The gate conductive layer 104 located at the lowermost layer in each of the gate stacks GST may serve as the gate of the source selection transistor and the source selection line SSL illustrated in FIG. 3.

In an embodiment, the case in which the gate conductive layer 104 serving as the gate of the source selection transistor and the source selection line is formed as a single layer is taken as an example. However, the embodiment is not limited thereto. In a modified example (not shown), several gate conductive layers 104 located at the bottom of the gate stack GST, including the gate conductive layer 104 located at the lowermost layer of the gate stack GST, may be used as the gate of the source selection transistor and the source selection line.

In the present embodiment, as shown in FIGS. 4 and 5, the case in which the lowermost gate conductive layer 104 serving as the source selection line in each of the gate stacks GST is formed as one pattern at the same level is taken as an example. However, the embodiment is not limited thereto. In a modified example (not shown), the lowermost gate conductive layer 104 serving as the source selection line in each of the gate stacks GST may be configured as two or more patterns which are isolated from each other at the same level.

At least the gate conductive layer 104 located at the uppermost layer in each of the gate stacks GST may serve as the gate of the drain selection transistor and the drain selection lines DSL1 and DSL2 illustrated in FIG. 3. The gate conductive layer 104 located at the uppermost layer in each of the gate stacks GST may be separated into two or more patterns which are spaced apart from each other at the same level by one or more isolation layers 106. The isolation layer 106 may correspond to the first slit S1 illustrated in FIG. 3. Therefore, the gate conductive layers 104 located on one side and the other side of the isolation layer 106 in the first direction D1, as illustrated in FIG. 4, may correspond to the first and second drain selection lines DSL1 and DSL2 illustrated in FIG. 3, respectively. The isolation layer 106 may include any one dielectric layer selected from the group consisting of an oxide layer, a nitride layer and an oxynitride layer. For example, the isolation layer 106 may be formed of an oxide layer.

In an embodiment, the case in which the gate conductive layer 104 serving as the gate of the drain selection transistor and the drain selection line is formed as a single layer is taken as an example. However, the embodiment is not limited thereto. In a modified example (not shown), several gate conductive layers 104 located at the top of the gate stack GST, including the gate conductive layer 104 located at the uppermost layer of the gate stack GST, may be used as the gate of the drain selection transistor and the drain selection line.

Each of the gate conductive layers 104 located between the gate conductive layer 104 serving as the source selection line and the gate conductive layer 104 serving as the drain selection line in each of the gate stacks GST may serve as the gate of a memory cell transistor and a word line. Therefore, the gate conductive layers 104 located between the uppermost gate conductive layer 104 and the lowermost gate conductive layer 104 in the gate stack GST, as shown in FIG. 4, may correspond to the plurality of word lines WL1 to WLn illustrated in FIG. 3.

The plurality of channel structures CH may be arranged in a matrix structure in the gate stack GST. Each of the channel structures CH may have a plan shape corresponding to a polygonal shape such as a triangle, a circular shape or an elliptical shape. Each of the channel structures CH may be formed through the gate stack GST, and have a lower end extended into the source layer SL. Specifically, the lower end of the channel structure CH may be formed through the first source layer SL1 and the third source layer SL3, and the bottom surface of the channel structure CH may be located in the first source layer SL1. Through the lower end extended into the source layer SL, each of the channel structures CH may be electrically coupled to the source layer SL.

Each of the channel structures CH may be a pattern that is formed in a pillar shape extended in the third direction D3, and has a high aspect ratio. As shown in FIG. 4, a line width TD of the uppermost end of each of the channel structures CH may be larger than a line width BD of the lowermost end thereof, and each of the channel structures CH may have inclined sidewalls. That is, each of the channel structures CH may have a trapezoid-type cross-sectional shape whose top side has a larger line width than the bottom side of the trapezoid, and which has a line width that gradually decreases from top to bottom in the third direction D3.

Figure 6A:
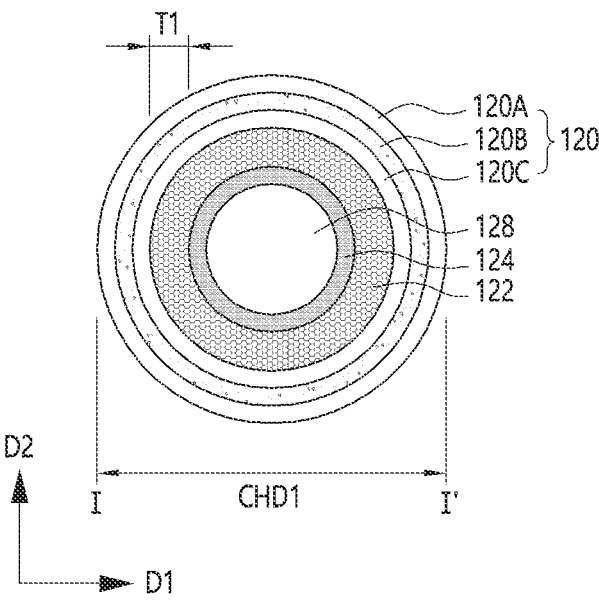
FIGS. 6A, 6B, and 6C are plan views of a channel structure, taken along lines I-I', II-II' and III-III' of FIG. 4, respectively.
Figure 6B:
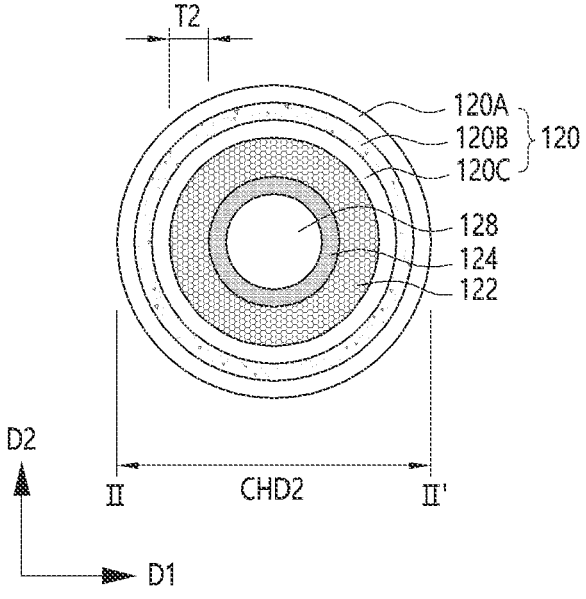
Figure 6C:
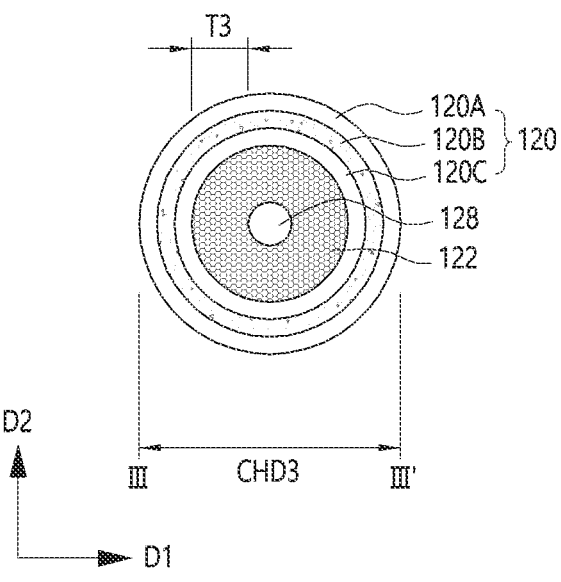

Specifically, as illustrated in FIGS. 6A to 6C, a first line width CHD1 of the top of the channel structure CH may be larger than a second line width CHD2 of the middle of the channel structure CH and a third line width CHD3 of the bottom of the channel structure CH CHD1>CHD2 and CHD3). The second line width CHD2 of the middle of the channel structure CH may be larger than the third line width CHD3 of the bottom of the channel structure CH (CHD2>CHD3).

As shown in FIG. 4, each of the channel structures CH may include a core pillar 128 extended in the third direction D3, a capping layer 126 formed over the core pillar 128, a channel layer 122 covering the side surface of the capping layer 126 and the side and bottom surfaces of the core pillar 128, a memory layer 120 covering the side surface and bottom surfaces of the channel layer 122, and a channel passivation layer 124 inserted between the core pillar 128 and the channel layer 122 within the gate stack GST.

The core pillar 128 may be formed through the gate stack GST, and have a lower end formed in a pillar shape extended into the source layer SL. Therefore, the core pillar may have a trapezoid-type cross-sectional shape. The core pillar 128 may include any one dielectric layer selected from the group consisting of an oxide layer, a nitride layer and an oxynitride layer. For example, the core pillar 128 may include an oxide layer.

The capping layer 126 may be located over the core pillar 128 and may have a pillar shape. The capping layer 126 may serve as a junction region of the drain selection transistor. The interface between the core pillar 128 and the capping layer 126 may be aligned with the surface of the gate conductive layer 104 located at the uppermost layer of the gate stack GST or may be located at a higher level than the surface of the gate conductive layer 104. The bottom surface of the capping layer 126 may abut on the core pillar 128 and the channel passivation layer 124. The capping layer 126 may be electrically coupled to the channel layer 122 covering the side surface of the core pillar 128. The capping layer 126 may include a doped semiconductor layer. For example, the capping layer 126 may include an n-type doped silicon layer.

The channel layer 122 may have a cylinder shape to cover the side surface of the capping layer 126 and the side and bottom surfaces of the core pillar 128. As shown in FIG. 5, the channel layer 122 may include a first region R1 which covers a portion of the side surface of the core pillar 128 and a second region R2 which abuts on the first region R1 and covers the other portion of the side surface of the core pillar 128 and the bottom surface of the core pillar 128. The first region R1 may indicate the channel layer 122 formed in the gate stack GST, and the second region R2 may indicate the channel layer 122 formed in the source layer SL. Therefore, although the channel layer 122 has a cylinder shape as a whole, the channel layer 122 of the first region R1 may have a pipe shape, and the channel layer 122 of the second region R2 may have a cylinder shape. Referring to FIGS. 6A to 6C, a thickness T1 or T2 of the channel layer 122 of the first region R1 in the channel structure CH may be smaller than a thickness T3 of the channel layer 122 of the second region R2. For reference, the cylinder shape may indicate a pillar shape whose top surface is open and which has a cavity formed therein. That is, the cylinder shape may be similar to a cup shape. Furthermore, the pipe shape may indicate a pillar shape whose top and bottom surfaces are open and which has a cavity formed therein.

The channel layer 122 may be electrically coupled to the source layer SL (not shown). Specifically, the channel layer 122 of the second region R2 may be electrically coupled to the third source layer SL3. Therefore, the channel layer 122 of the second region R2 may serve as the junction region of the source selection transistor. The channel layer 122 may include a semiconductor layer having a polycrystalline state. For example, the channel layer 122 may include a polycrystalline silicon layer.

As shown in FIG. 5, the memory layer 120 may have a cylinder shape to cover part of the side surface of the channel layer 122. The memory layer 120 may have a structure in which a blocking layer 120A, a charge trap layer 120B and a tunnel dielectric layer 120C are sequentially stacked. Each of the blocking layer 120A, the charge trap layer 120B and the tunnel dielectric layer 120C may include any one selected from the group consisting of an oxide layer, a nitride layer and an oxynitride layer. For example, the tunnel dielectric layer 120C may have a shape to cover part of the side surface of the channel layer 122, and include an oxide layer. The charge trap layer 120B may have a shape to cover the side surface of the tunnel dielectric layer 120C, and include a nitride layer. The blocking layer 120A may have a shape to cover the side surface of the charge trap layer 120B, and include an oxide layer.

In an embodiment, the case in which the memory layer 120 has an ONO structure in which an oxide layer, a nitride layer and an oxide layer are stacked is taken as an example. However, the embodiment is not limited thereto. The memory layer 120 may include various material layers according to characteristics required by the semiconductor memory device, and have various stack structures.

As shown in FIG. 4, the channel passivation layer 124 may have a pipe shape to cover the side surface of the core pillar 128. The outer wall of the channel passivation layer 124 may be aligned with the sidewall of the capping layer 126. As shown in FIG. 5, the channel passivation layer 124 may serve to stably scale down the thickness of the channel layer 122 in the first region R1, and remove a surface defect of the channel layer 122, such as a pinhole. To scale down means to reduce in size. To stably scale down means to reduce in size in a manner not likely to give way or fail. The channel passivation layer 124 may be inserted between the core pillar 128 and the channel layer 122 in the gate stack GST. In other words, the channel passivation layer 124 may be formed only in the first region R1, and not be formed in the second region R2 of the channel layer 122. Therefore, due to the channel passivation layer 124, the thickness of the channel layer 122 in the first region R1 may be smaller than that of the channel layer 122 in the second region R2. That is in order to prevent surface defects such as pinholes from excessively occurring in the channel layer 122 during the process of forming the channel layer 122 and the channel passivation layer 124, and to prevent damage to the source layer SL. Furthermore, this is in order to improve the contact characteristic between the source layer SL and the channel layer 122.

Referring to FIGS. 6A to 6C, the thickness of the memory layer 120 in each of the top, middle and bottom of the channel structure CH is constant, but the line widths of the core pillar 128 at the top, middle and bottom of the channel structure CH may be different from one another according to the line widths of the top, middle and bottom of the channel structure CH. That is, the channel structure CH and the core pillar 128 may have the same cross-sectional shape. The first thickness T1 of the channel layer 122 formed at the top of the channel structure CH may be substantially equal to the second thickness T2 of the channel layer 122 formed at the middle of the channel structure CH, due to the channel passivation layer 124. However, since the channel passivation layer 124 is not formed at the bottom of the channel structure CH, the third thickness T3 of the channel layer 122 formed at the bottom of the channel structure CH may be larger than the first and second thicknesses T1 and T2. The sum of the thickness T1 or T2 of the channel layer 122 and the thickness of the channel passivation layer 124 in the first region R1 may be substantially equal to or larger than the thickness T2 of the channel layer 122 in the second region R2. For example, in the channel structure CH, the thickness T1 or T2 of the channel layer 122 in the first region R1 may range from 40 Å to 90 Å, and the thickness T3 of the channel layer 122 in the second region R2 may range from 50 Å to 100 Å. Furthermore, the thickness of the channel passivation layer 124 may range from 10 Å to 50 Å. For reference, in an embodiment, the case in which the sum of the thickness T1 or T2 of the channel layer 122 and the thickness of the channel passivation layer 124 in the first region R1 is substantially equal to the thickness T2 of the channel layer 122 in the second region R2 is taken as an example.

The channel passivation layer 124 may be formed by oxidizing the channel layer 122. This is in order to remove surface defects such as pinholes while stably scaling down the thickness of the channel layer 122. To this end, the channel passivation layer 124 may include a dielectric layer formed at higher temperature than the crystallization anneal temperature of the channel layer 122. For example, the channel passivation layer 124 may include a silicon oxide layer formed through radical oxidation at a temperature of 600° C. to 800° C.

The reason why the channel passivation layer 124 is formed only in the first region R1 of the channel layer 122 and not formed in the second region R2 of the channel layer 122 is that the channel layer 122 in the second region R2 serves as the junction region of the source selection transistor. Specifically, since the channel layer 122 in the second region R2 is located at the bottom of the channel structure CH having a high aspect ratio, it is substantially impossible to form a junction region through ion implantation. The junction region is formed through diffusion from the source layer SL. Therefore, when the channel passivation layer 124 is formed in the channel layer 122 of the second region R2, the thickness of the channel layer 122 serving as the junction region may be scaled down to degrade the operation reliability of the semiconductor memory device.

As described above, an advantage of the present disclosure is that the semiconductor memory device in accordance with an embodiment may include the channel passivation layer 124, and thus stably scale down the thickness of the channel layer 122 and remove surface defects of the channel layer 122, thereby improving the operation reliability of the semiconductor memory device.

Furthermore, since the channel passivation layer 124 is formed only in the first region R1 of the channel layer 122 and not formed at the bottom of the channel structure CH, i.e., the second region R2 of the channel layer 122, it is possible to prevent surface defects from excessively occurring in the channel layer 122 between processes, and to prevent damage to the source layer SL. Furthermore, it is possible to improve the contact characteristic between the source layer SL and the channel layer 122.

Figure 7:
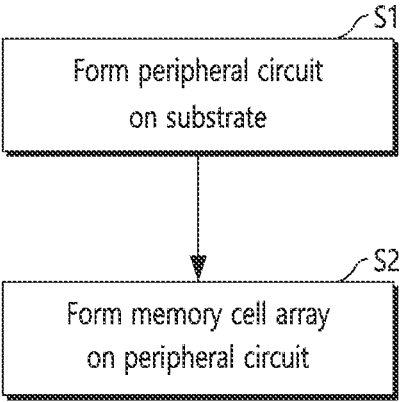
FIG. 7 is a flowchart schematically illustrating a method for fabricating a semiconductor memory device in accordance with an embodiment.

FIG. 7 is a flowchart schematically illustrating a method for fabricating a semiconductor memory device in accordance with an embodiment.

As illustrated in FIG. 7, the method for fabricating a semiconductor memory device may include step S1 of forming a peripheral circuit on a substrate and step S2 of forming a memory cell array on the peripheral circuit.

In step S1, the peripheral circuit may be provided on the substrate. The peripheral circuit may include a plurality of transistors. Sources and drains of the respective transistors may be formed in a partial region of the substrate, and gate electrodes of the respective transistors may be formed on the substrate.

In step S2, the memory cell array may be formed on the peripheral circuit. Step S3 may include forming the source layer SL illustrated in FIG. 3, forming the gate stacks GST illustrated in FIG. 3, and forming the bit lines BL illustrated in FIG. 3.

Although not illustrated the drawing, conductive patterns for interconnections may be formed on the peripheral circuit before step S2, and the memory cell array may be formed on the interconnections.

The method may further include the step of forming a memory layer on side and bottom surfaces of the channel holes before forming the semiconductor layer, wherein the memory layer is formed as a stacked layer in which a blocking layer, a charge trap layer and a tunnel dielectric layer are stacked.

The method may further include the steps of: forming a core pillar on the channel passivation layer and the channel layer after forming the channel passivation layer, such that the core pillar gap-fills the channel hole; forming a recess by etching the top of the core pillar; expanding the recess by etching the channel passivation layer exposed to a side surface of the recess; and forming a capping layer which gap-fills the expanded recess and is electrically coupled to the channel layer.

The step of forming the channel layer may include: forming a semiconductor layer along the surfaces of the channel holes, the semiconductor layer having a first thickness; forming a crystallized semiconductor layer by performing a crystallization anneal process; and etching the crystallized semiconductor layer to have a second thickness smaller than the first thickness. The forming of the semiconductor layer, the crystallization anneal process and the etching may be repeatedly performed one or more times.

The method may further include the step of forming a crystallization support layer on the semiconductor layer before performing the crystallization anneal process, wherein the crystallization support layer may be removed in the step of etching the crystallized semiconductor layer to have the second thickness.

In accordance with the present embodiments, the semiconductor memory device may include the channel passivation layer, thereby stably scaling down the thickness of the channel layer and removing surface defects of the channel layer.

Furthermore, as the channel passivation layer is formed only in the surface of the channel layer formed in the gate stack, it is possible to prevent defects from excessively occurring in the surface of the channel layer between processes, and to prevent damage to the source layer. Moreover, it is possible to improve the contact characteristic between the source layer and the channel layer.

As such, the channel passivation layer included in the gate stack may improve the operation reliability of the semiconductor memory device.

Furthermore, when the channel layer is formed, the deposition, the crystallization anneal process and the etching may be repeatedly performed two or more times, which makes it possible to effectively increase the sizes of grains within the channel layer.

Moreover, the crystallization support layer may be formed when the channel layer is formed, which makes it possible to more effectively increase the sizes of the grains within the channel layer.

As such, the sizes of the grains in the channel layer may be increased to further improve the operation reliability of the semiconductor memory device.

Figure 8:
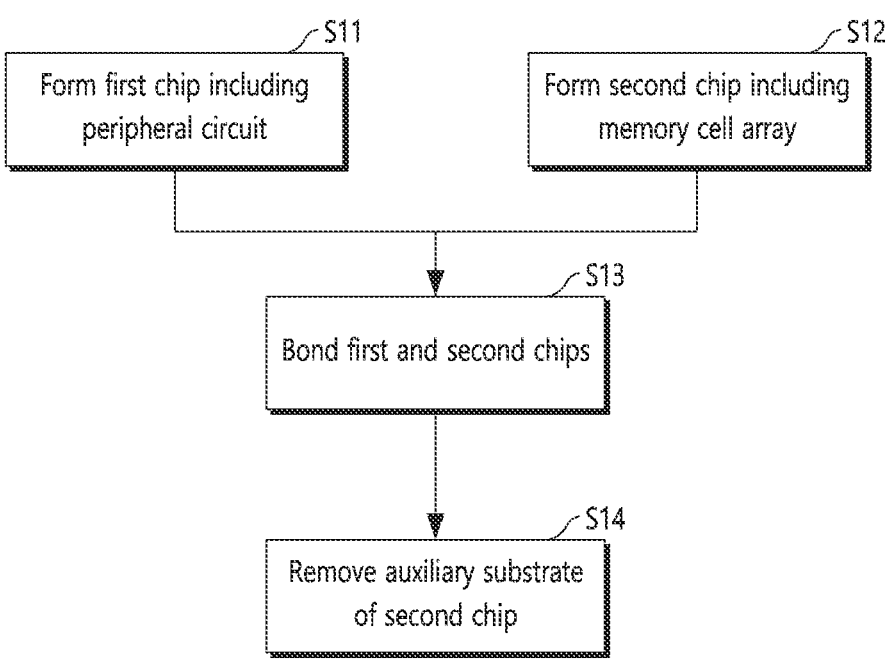
FIG. 8 is a flowchart schematically illustrating a method for fabricating a semiconductor memory device in accordance with an embodiment.

FIG. 8 is a flowchart schematically illustrating a method for fabricating a semiconductor memory device in accordance with an embodiment.

As illustrated in FIG. 8, the method for fabricating a semiconductor memory device may include step S11 of forming a first chip including a peripheral circuit, step S12 of forming a second chip including a memory cell array, step S13 of bonding the first and second chips, and step S14 of removing an auxiliary substrate of the second chip.

In step S11, the peripheral circuit may be provided on a main substrate. The first chip may include first interconnections connected to the peripheral circuit.

In step S12, the memory cell array may be formed on the auxiliary substrate. Step S12 may include forming the source layer SL illustrated in FIG. 3, forming the gate stacks GST illustrated in FIG. 3, and forming the bit lines BL illustrated in FIG. 3. The second chip may further include second interconnections connected to the memory cell array.

FIG. 3 illustrates the case in which the memory cell array is formed by sequentially stacking the source layer SL, the gate stacks GST and the bit lines BL, but the embodiment is not limited thereto. In a modified example, the memory cell array in step S12 may have a structure in which the gate stacks are formed on the bit line and no source layer is formed (not shown).

In step S13, the second chip may be aligned on the first chip such that the first interconnections and the second interconnections face each other, and some of the first interconnections and some of the second interconnections may be bonded to each other.

In step S14, the auxiliary substrate of the second chip may be removed to form a semiconductor memory device in which the peripheral circuit and the memory cell array overlap each other.

In a modified example, when the memory cell array in step S12 has a structure in which the gate stacks are formed on the bit line and no source layer is formed (not shown), the source layer connected to the channel structures may be formed after step S14.

FIGS. 9A to 9H are cross-sectional views illustrating the method for fabricating a semiconductor memory device in accordance with an embodiment. FIGS. 9A to 9H are cross-sectional views illustrating a method for fabricating a memory cell array of a semiconductor memory device. Hereafter, the method for fabricating a memory cell array, which will be described below with reference to FIGS. 9A to 9H, may be included in step S2 illustrated in FIG. 7 or step S12 illustrated in FIG. 8.

Figure 9A:
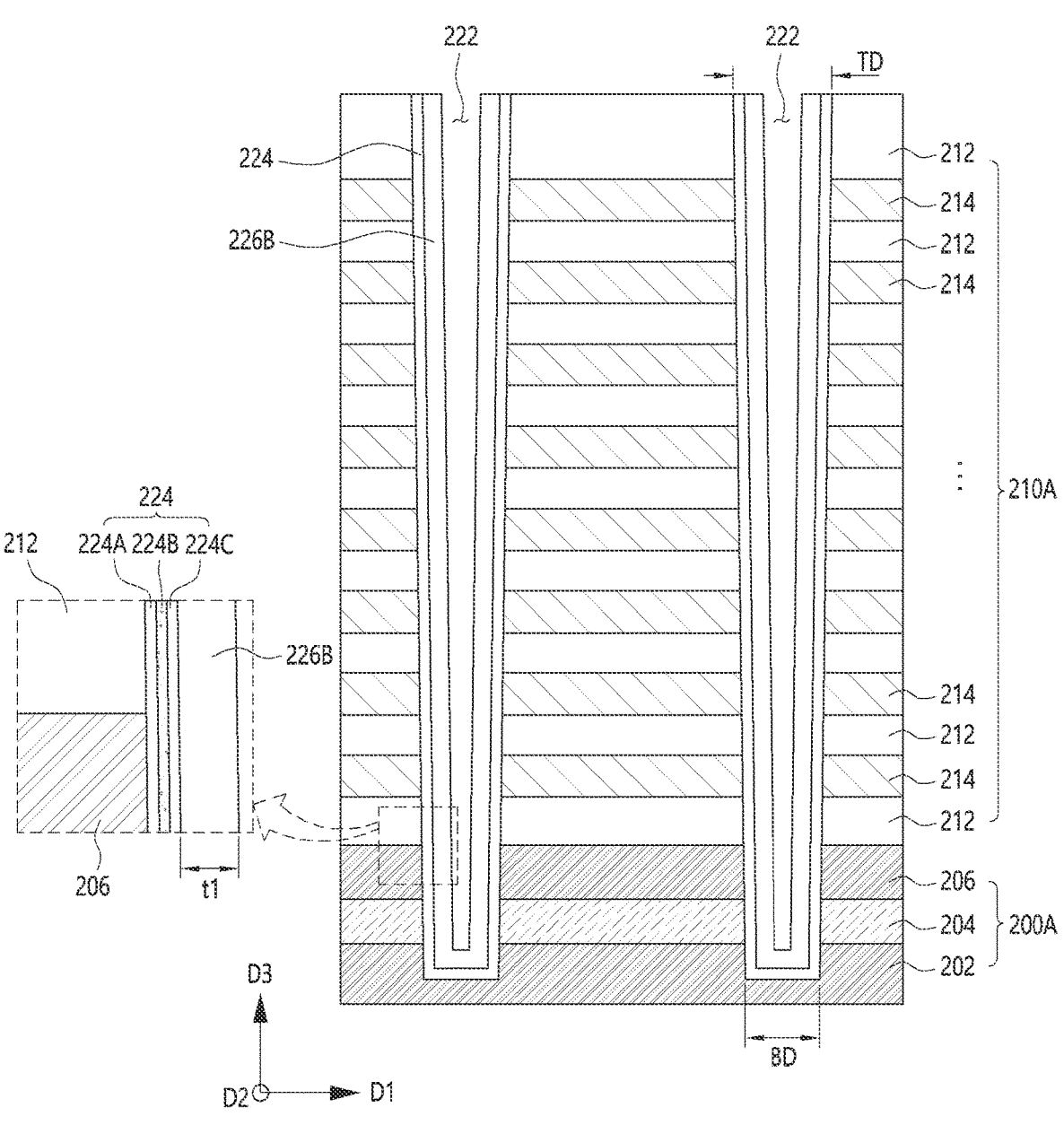
FIGS. 9A, 9B, 9C, 9D, 9E, 9F, 9G and 9H are cross-sectional views illustrating a method for fabricating a semiconductor memory device in accordance with an embodiment.

As illustrated in FIG. 9A, a pre-source layer 200A is formed on a substrate (not illustrated) in which a predetermined structure, for example, the peripheral circuit PC (see FIGS. 1 and 3) is formed. The pre-source layer 200A may be formed as a stacked layer in which a first source layer 202, a source sacrificial layer 204 and a second source layer 206 are sequentially stacked. The pre-source layer 200A may have a plate shape extended in a first direction D1 and a second direction D2. Each of the first and second source layers 202 and 206 may include a doped semiconductor layer 226B. For example, each of the first and second source layers 202 and 206 may include an n-type doped silicon layer. The source sacrificial layer 204 may be formed of a material having an etch selectivity with the first and second source layers 202 and 206. For example, the source sacrificial layer 204 may be formed as any one single layer selected from the group consisting of an oxide layer, a nitride layer and an oxynitride layer or a stacked layer of two or more layers selected from the group. For example, the source sacrificial layer 204 may be formed of an oxide layer.

Then, a stacked body 210A is formed on the pre-source layer 200A, the stacked body 210A including a plurality of interlayer dielectric layers 212 and a plurality of gate sacrificial layers 214, which are alternately stacked therein. At each of the lowermost layer and the uppermost layer of the stacked body 210A, the interlayer dielectric layer 212 may be located. The interlayer dielectric layer 212 located at the uppermost layer of the stacked body 210A may be formed to have a larger thickness than the other interlayer dielectric layers 212. The gate sacrificial layer 214 may be formed of a material having an etch selectivity with the interlayer dielectric layer 212. Each of the interlayer dielectric layer 212 and the gate sacrificial layer 214 may include any one selected from the group consisting of an oxide layer, a nitride layer and an oxynitride layer. For example, the interlayer dielectric layer 212 may be formed of an oxide layer, and the gate sacrificial layer 214 may be formed of a nitride layer.

Then, a hard mask pattern (not illustrated) is formed on the stacked body 210A, and a plurality of channel holes 222 are formed by etching the stacked body 210A and the pre-source layer 200A using the hard mask pattern as an etch barrier. In the stacked body 210A, the channel holes 222 may be arranged in a matrix structure. Each of the channel holes 222 may have a hole-type shape which passes through the stacked body 210A, the second source layer 206 and the source sacrificial layer 204, and has an end extended into the first source layer 202. Each of the channel holes 222 may be a pattern with a high aspect ratio, and have inclined sidewalls. A line width TD of the top entrance of the channel hole 222 may be smaller than a line width BD of the bottom surface of the channel hole 222. That is, each of the channel holes 222 may have a trapezoid-type cross-sectional shape whose line width gradually decreases in a direction from the top entrance toward the bottom surface.

Although not illustrated in the drawings, an isolation layer may be formed through at least the gate sacrificial layer 214 located at the uppermost layer in the stacked body 210A before the channel holes 222 are formed. That is, the isolation layer may be formed to isolate at least the gate sacrificial layer 214, located at the uppermost layer in the stacked body 210A, into two or more patterns. The isolation layer may correspond to the first slit S1 illustrated in FIG. 3. The isolation layer may include a dielectric layer. For example, the isolation layer may be formed of an oxide layer.

Then, a memory layer 224 is formed along the surface of each of the channel holes 222. The memory layer 224 may be formed as a stacked layer in which a blocking layer 224A, a charge trap layer 224B and a tunnel dielectric layer 224C are sequentially stacked. For example, the blocking layer 224A and the tunnel dielectric layer 224C may be formed of an oxide layer, and the charge trap layer 224B may be formed of a nitride layer.

Then, a semiconductor layer 226B having a first thickness t1 is formed on the memory layer 224 along the surface of each of the channel holes 222. The semiconductor layer 226B may have a cylinder shape. The semiconductor layer 226B may have an amorphous state or polycrystalline state, and include silicon. For example, the semiconductor layer 226B may be formed of s polycrystalline silicon layer.

The first thickness t1 of the semiconductor layer 226B may be about two or more times larger than the target thickness of a channel which finally remains. This is in order to easily increase the sizes of grains during a subsequent crystallization anneal process. For example, the semiconductor layer 226B may be formed to have the first thickness t1 of 100 Å to 200 Å.

Figure 9B:
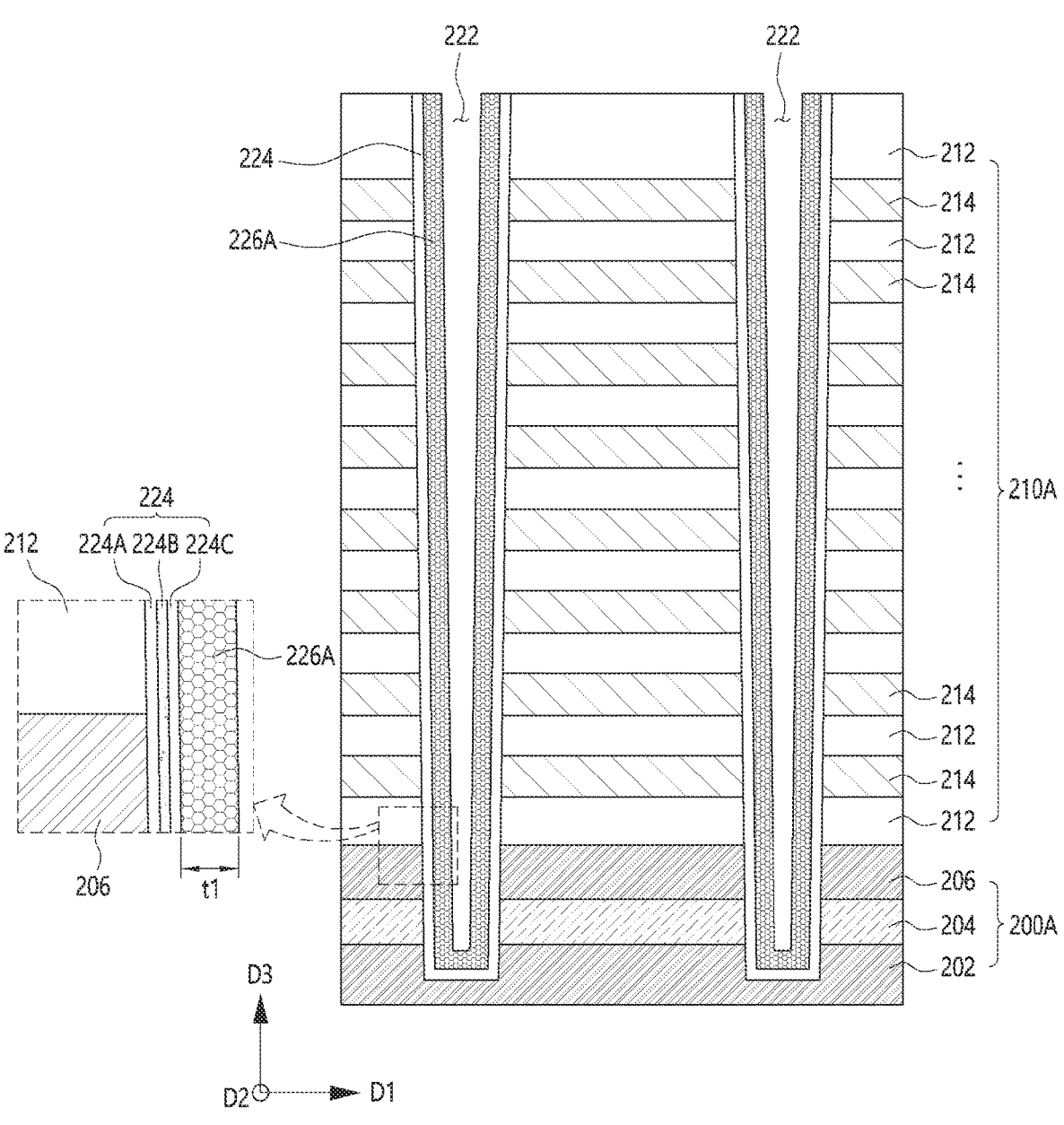

As illustrated in FIG. 9B, the crystallization anneal process for increasing the sizes of grains within the semiconductor layer 226B is performed to form a crystallized semiconductor layer 226A. The crystallization anneal process may be performed at a temperature of 400° C. to 800° C. for four to eight hours. For example, the crystallization anneal process may be performed at 600° C.

Figure 9C:
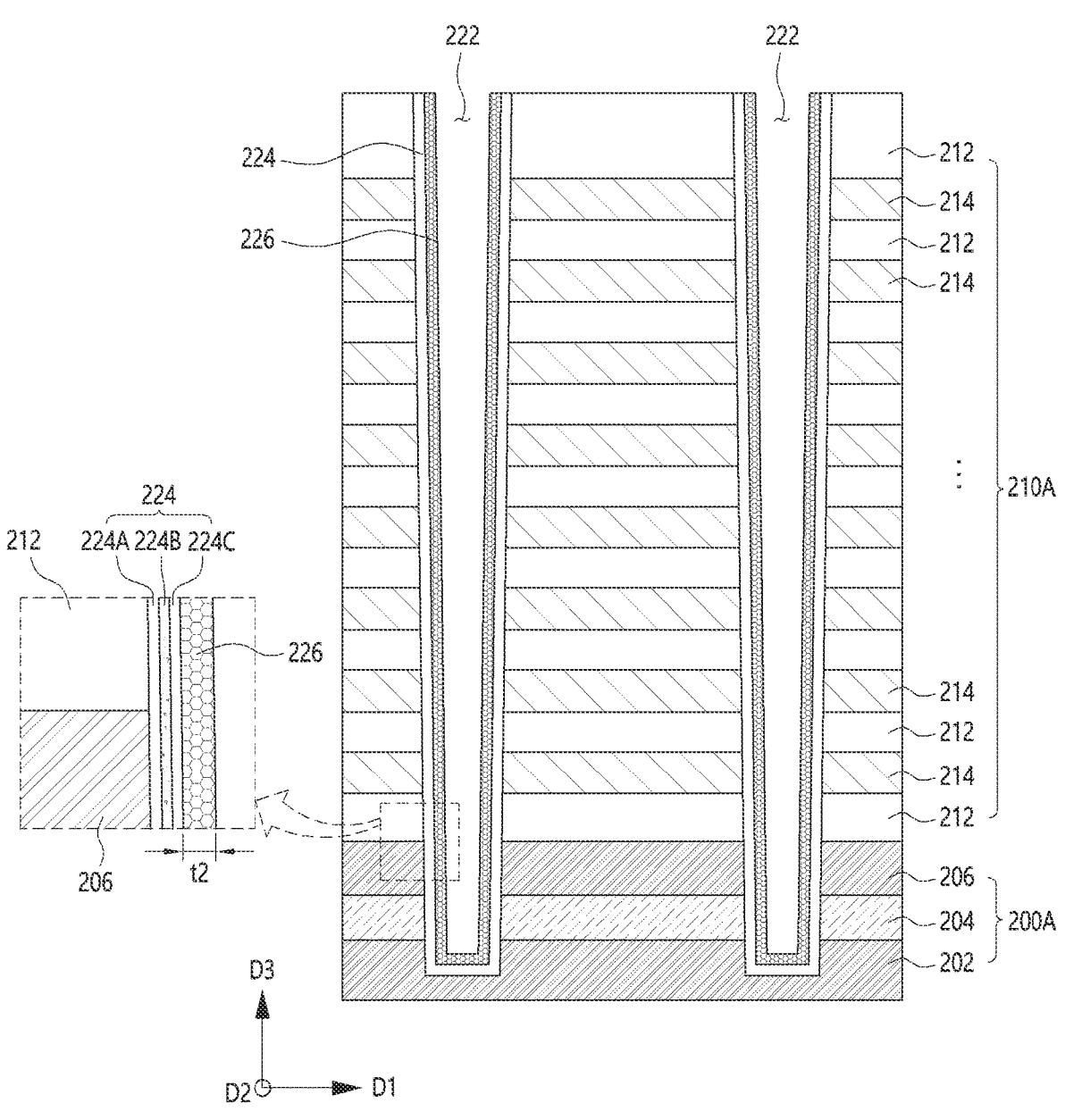

As illustrated in FIG. 9C, a channel layer 226 is formed by etching the crystallized semiconductor layer 226A to have a second thickness t2 smaller than the first thickness t1. At this time, isotropic wet etching or isotropic dry etching may be performed as the etching process.

The second thickness t2 may be about a half of the first thickness t1. For example, when the first thickness t1 ranges from 100 Å to 200 Å, the second thickness t2 may range from 50 Å to 100 Å.

When the thickness of the channel layer 226 is scaled down to the second thickness t2 or less during the etching process, surface defects such as pinholes may excessively occur on the surface of the channel layer 226. Furthermore, the pre-source layer 200A may be damaged by an etching agent used for the etching process. However, in order to secure operation characteristics of a memory cell transistor in a highly integrated semiconductor memory device, the channel layer 226 is required to have as small a thickness as possible. Thus, there is a need for a method capable of stably scaling down the thickness of the channel layer 226 to the second thickness t2 or less.

Figure 9D:
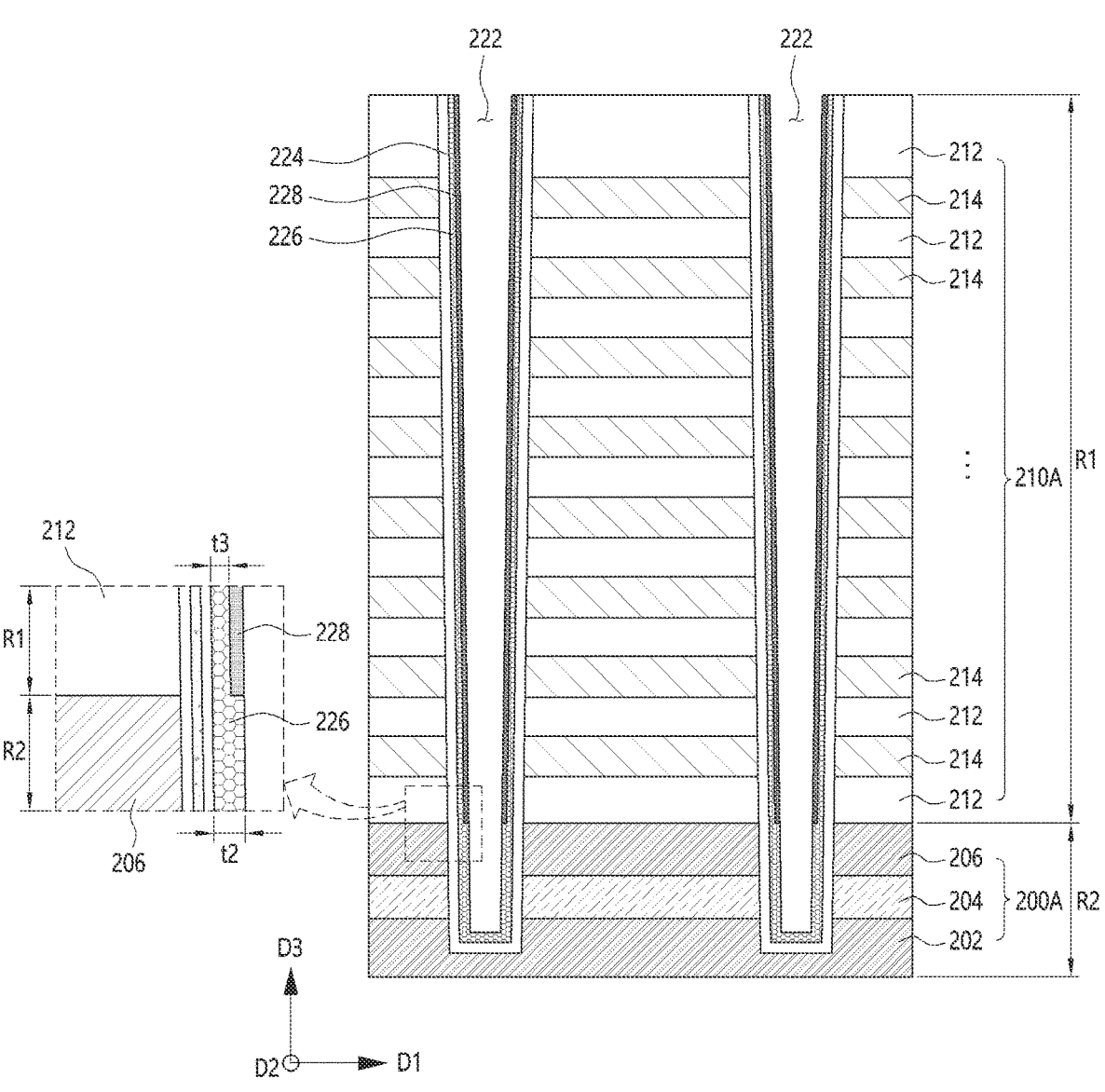

As illustrated in FIG. 9D, a channel passivation layer 228 is formed on a part of the surface of the channel layer 226. The channel passivation layer 228 may be formed of a silicon-containing dielectric layer. Specifically, the channel layer 226 may be divided into a first region R1 formed in the stacked body 210A and a second region R2 formed in the pre-source layer 200A so as to abut on the first region R1. Due to the channel passivation layer 228, the channel layer 226 of the first region R1 may have a third thickness t3 smaller than the second thickness t2. For example, when the second thickness t2 ranges from 50 Å to 100 Å, the third thickness t3 may range from 40 Å to 90 Å.

The channel passivation layer 228 may serve to stably scale down the thickness of the channel layer 226, and remove surface defects such as pinholes by covering a grain boundary exposed to the surface of the channel layer 226. For this role, the channel passivation layer 228 may be formed through radial oxidation at higher temperature than the crystallization anneal temperature. That is, the channel passivation layer 228 may be formed by oxidizing a part of the channel layer 226. For example, when the channel layer 226 is formed of a polycrystalline silicon layer, the channel passivation layer 228 may be formed by oxidizing the surface of the channel layer 226 using a large quantity of oxygen radicals generated from a process gas in which a hydrogen gas and an oxygen gas are mixed. At this time, in order to easily produce a large quantity of oxygen radicals and to uniformly form the channel passivation layer 228 in the first region R1 of the channel layer 226, the radical oxidation may be performed at a temperature of 600° C. to 800° C. and a pressure of 0.1 torr to 1 torr. When the radical oxidation temperature is less than 600° C. and the process pressure exceeds 1 torr, the oxygen radicals may not reach the bottom of the channel hole 222, which makes it difficult to uniformly form the channel passivation layer 228 in the first region R1 of the channel layer 226. On the other hand, when the radical oxidation temperature exceeds 800° C. and the process pressure is less than 0.1 torr, it may be difficult to selectively form the channel passivation layer 228 only in the first region R1 of the channel layer 226.

Since the channel hole 222 has a high aspect ratio, the oxidation agent, i.e., the oxygen radicals may not reach the bottom of the channel hole 222, such that the channel passivation layer 228 is selectively formed only in the channel layer 226 of the first region R1. Furthermore, the mixture ratio of the hydrogen gas and the oxygen gas, the process temperature and the process pressure may be controlled to uniformly form the channel passivation layer 228 only in the channel layer 226 of the first region R1.

In a modified example, in order to selectively form the channel passivation layer 228 only in the first region R1 of the channel layer 226, the channel passivation layer 228 may be formed after a sacrificial layer (not illustrated) is formed to gap-fill the bottom of the channel hole 222. At this time, the sacrificial layer may be removed after the channel passivation layer 228 is formed.

The reason why the channel passivation layer 228 is not formed in the second region R2 of the channel layer 226 but selectively formed only in the first region R1 of the channel layer 226 is that the channel layer 226 of the second region R2 serves as the junction region of the source selection transistor. Specifically, since the channel layer 226 of the second region R2 is located at the bottom of the channel hole 222 having a high aspect ratio, it is substantially impossible to form a junction region through ion implantation. The junction region is formed through diffusion from a third source layer 208 which is to be formed through a subsequent process. Thus, when the channel passivation layer 228 is formed in the channel layer 226 of the second region R2, the thickness of the channel layer 226 serving as the junction region may be scaled down to degrade the operation reliability of the semiconductor memory device.

Figure 9E:
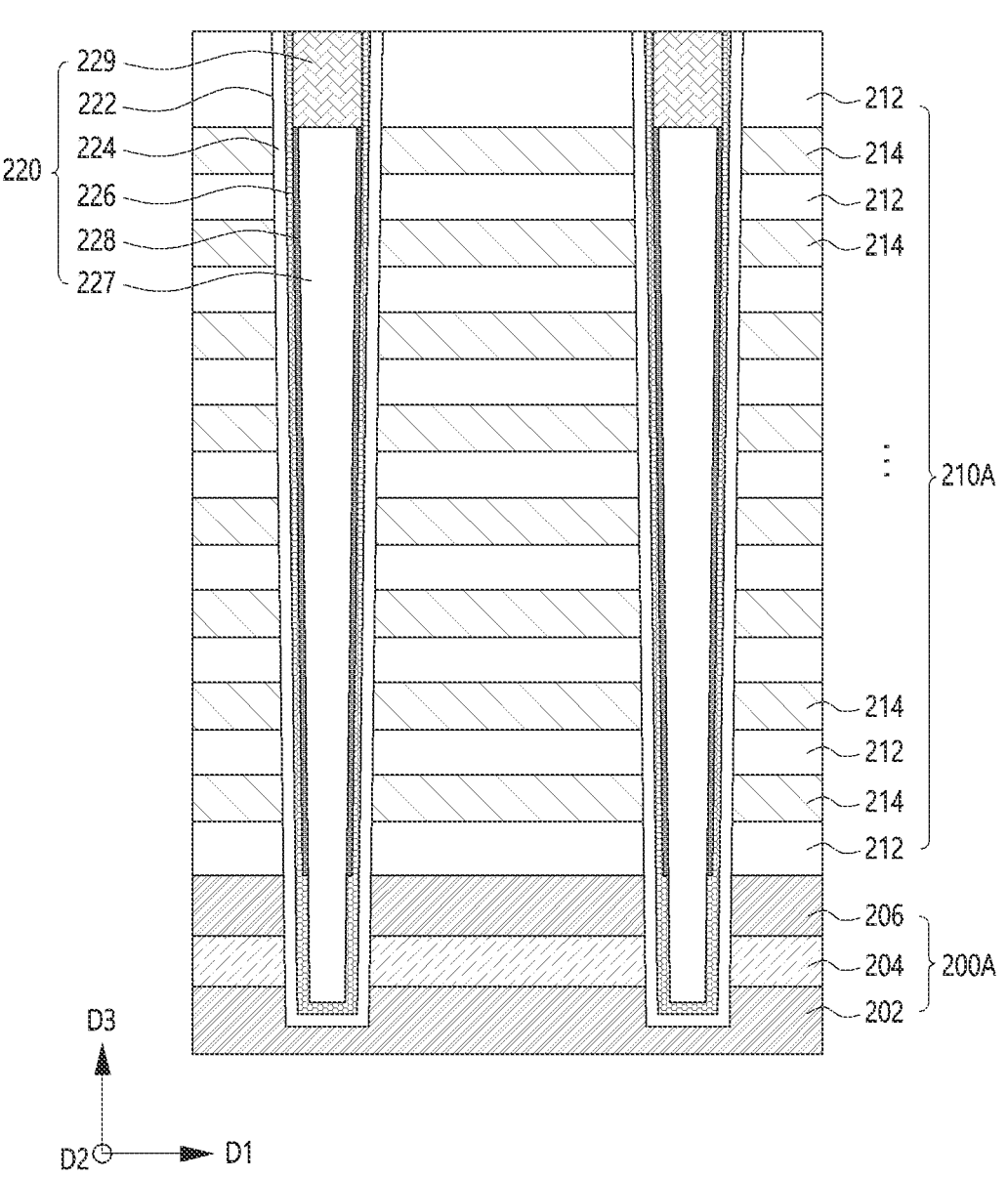

As illustrated in FIG. 9E, a core pillar 227 is formed on the channel layer 226 and the channel passivation layer 228 so as to gap-fill the channel hole 222. The core pillar 227 may have a trapezoid-type cross-sectional shape. The core pillar 227 may include any one dielectric layer selected from the group consisting of an oxide layer, a nitride layer and an oxynitride layer. For example, the core pillar 227 may include an oxide layer.

Then, a recess is formed by etching the top of the core pillar 227, and then extended by etching the channel passivation layer 228 exposed to the side surface of the recess. The bottom surface of the recess may be aligned with the surface of the gate sacrificial layer 214 located at the uppermost layer of the stacked body 210A, or located at a higher level than the surface of the gate sacrificial layer 214.

Then, a capping layer 229 is formed to gap-fill the recess. The capping layer 229 may serve as a junction region of a drain selection transistor. Therefore, the capping layer 229 may be formed of a doped semiconductor layer 226B, for example, an n-type doped silicon layer.

In this way, a channel structure may be may formed, which includes the core pillar 227 extended in the third direction D3, the capping layer 229 formed on the core pillar 227, the channel layer 226 covering the side surface of the capping layer 229 and the side and bottom surfaces of the core pillar 227, the memory layer 224 covering the side and bottom surfaces of the channel layer 226, and the channel passivation layer 228 inserted between the core pillar 227 and the channel layer 226.

Figure 9F:
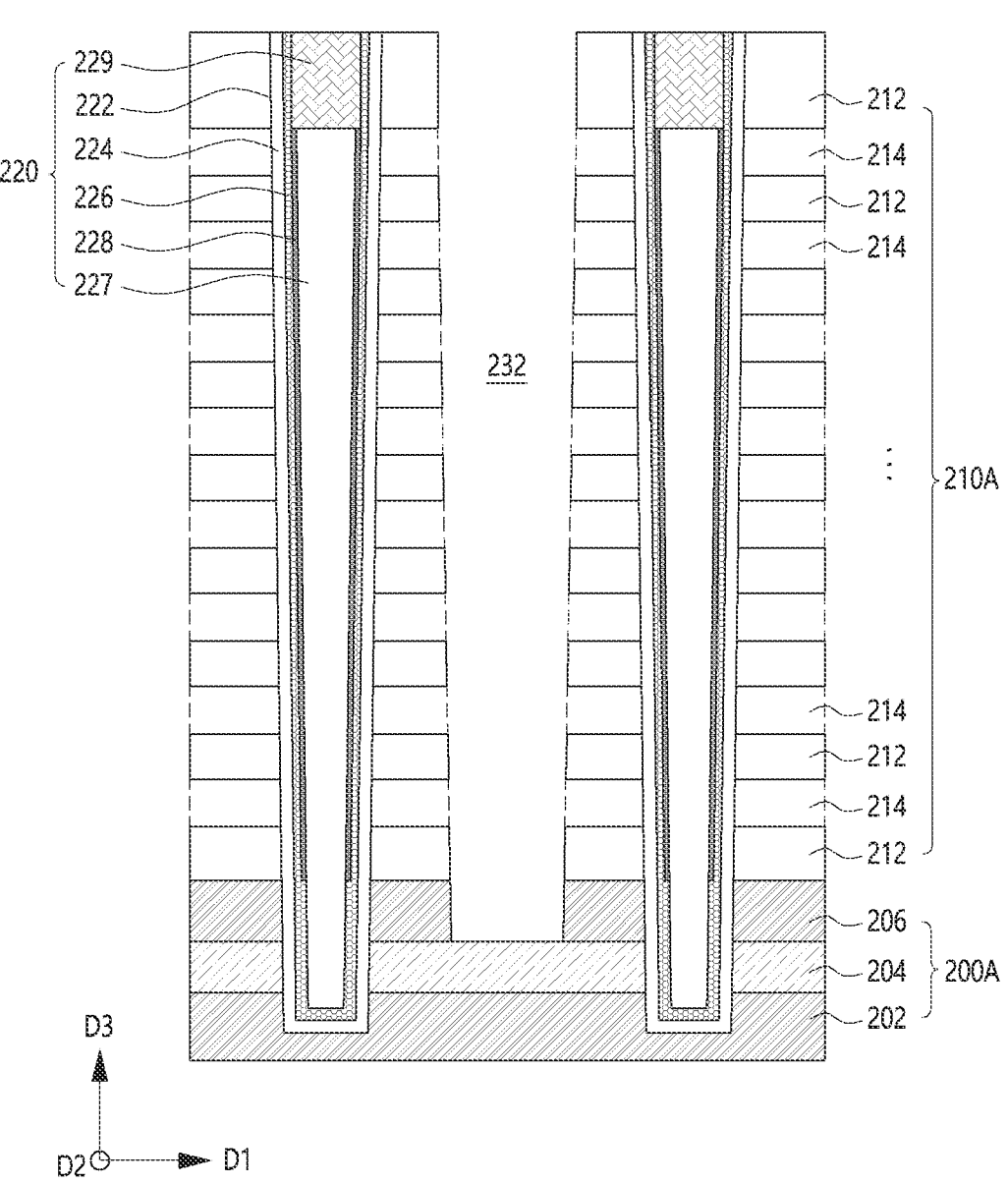

As illustrated in FIG. 9F, a hard mask pattern (not illustrated) is formed on a stacked body 210A having a plurality of channel structures 220 formed therein, and a slit trench 232 is formed by etching the stacked body 210A and the pre-source layer 200A using the hard mask pattern as an etch barrier. At this time, the slit trench 232 may be formed to expose the source sacrificial layer 204 through the bottom surface of the slit trench 232. The slit trench 232 may be formed as a line-type pattern extended in the second direction D2.

Then, the gate sacrificial layer 214 is removed through the slit trench 232.

Figure 9G:
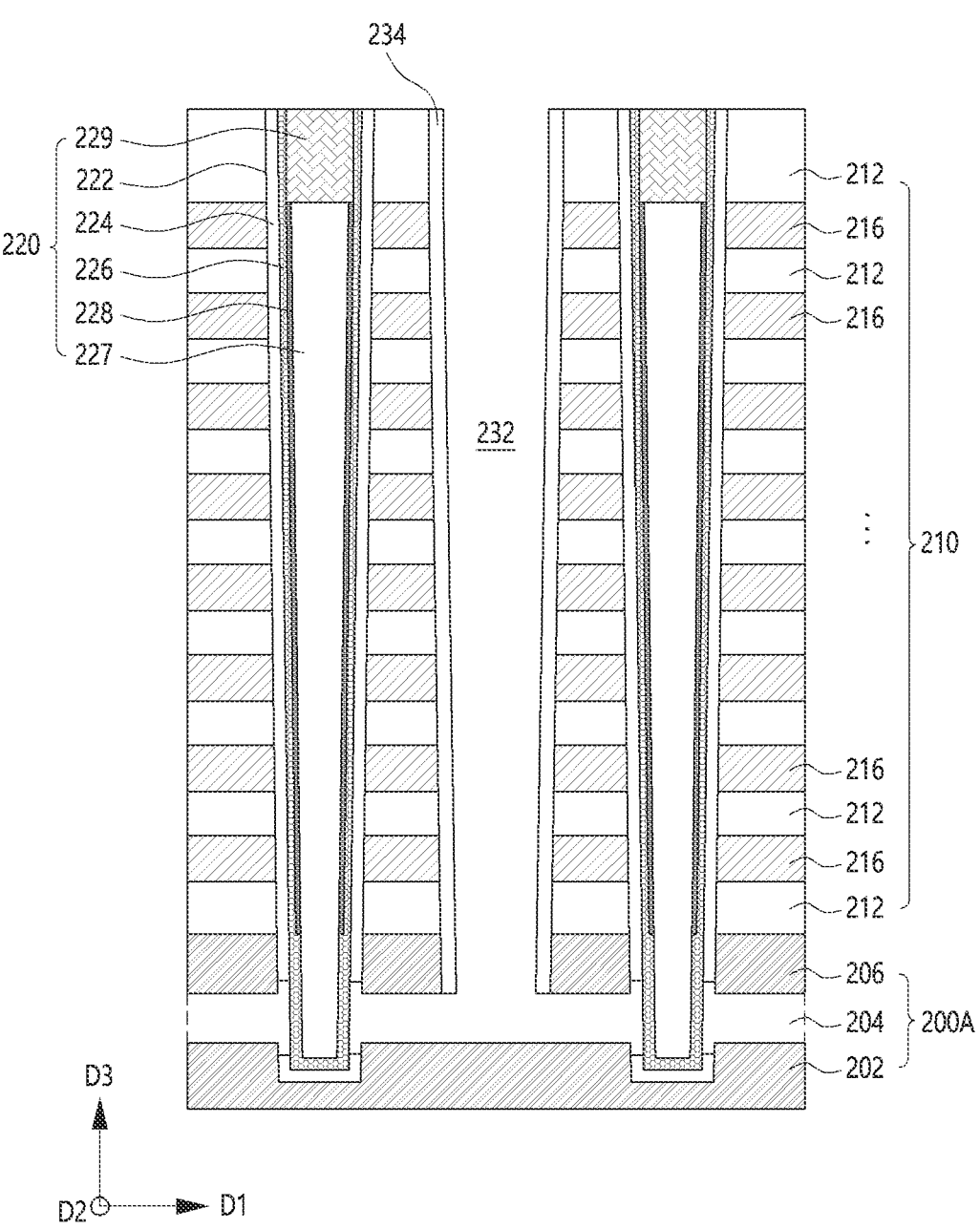

As illustrated in FIG. 9G, the space from which the gate sacrificial layer 214 has been removed is gap-filled with a gate conductive layer 216. The gate conductive layer 216 may include a metal-containing conductive layer. For example, the gate conductive layer 216 may be formed of a tungsten layer. For another example, the gate conductive layer 216 may be formed as a stacked layer in which a titanium nitride layer and a tungsten layer are stacked.

In this way, a gate stack 210 may be formed, in which the plurality of interlayer dielectric layers 212 and the plurality of gate conductive layers 216 are alternately stacked.

Then, an etch process for isolating the gate conductive layer 216 in the third direction D3 is performed, and a slit spacer 234 is formed on either side of the slit trench 232. The slit spacer 234 may be formed of a dielectric layer.

Then, the source sacrificial layer 204 of the pre-source layer 200A is removed through the slit spacer 234. Subsequently, the channel layer 226 is exposed by etching the memory layer 224 which is exposed as the source sacrificial layer 204 is removed.

Figure 9H:
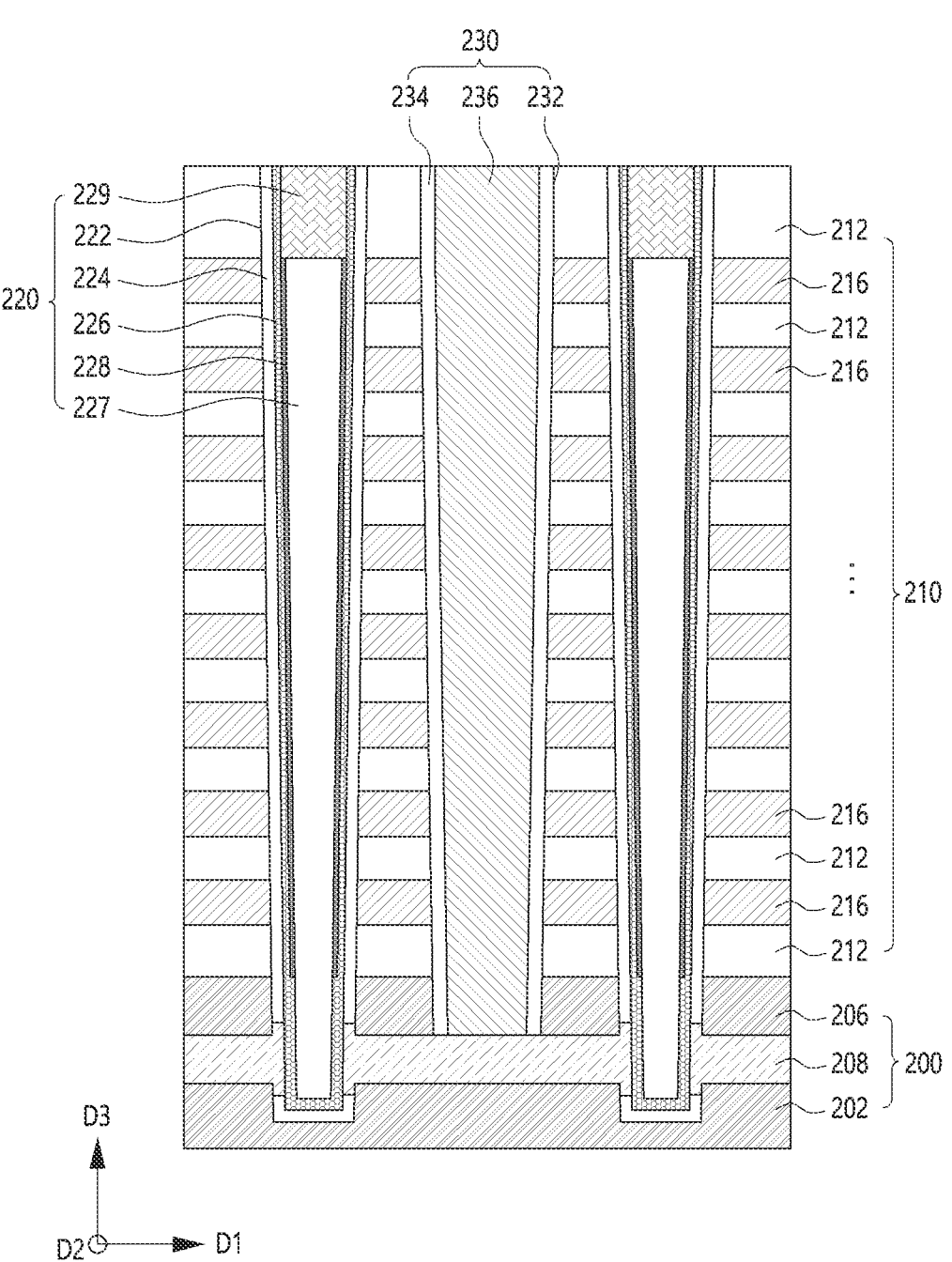

As illustrated in FIG. 9H, the space from which the source sacrificial layer 204 has been removed is gap-filled with the third source layer 208. The third source layer 208 may be electrically coupled to the channel layer 226. The third source layer 208 may be formed of a doped semiconductor layer 226B. For example, the third source layer 208 may be formed of an n-type doped silicon layer. At this time, the third source layer 208 may have a higher impurity doping concentration than the first and second source layers 202 and 206.

Then, a slit layer 236 is formed to gap-fill the slit trench 232. The slit layer 236 may be formed of a conductive layer. In a modified example, the slit layer 236 may be formed of a dielectric layer.

In this way, a slit structure 230 may be formed, which includes the source layer 200, the slit trench 232, the slit spacer 234 and the slit layer 236, the source layer 200 including the first source layer 202, the third source layer 208 and the second source layer 206, which are sequentially stacked.

Then, a subsequent process including a bit line formation process may be performed to complete the semiconductor memory device.

FIGS. 10A to 10D are cross-sectional views illustrating a method for fabricating a semiconductor memory device in accordance with an embodiment. FIGS. 10A to 10D are cross-sectional views illustrating a method for fabricating a memory cell array of a semiconductor memory device. Hereafter, the method for fabricating a memory cell array, which will be described below with reference to FIGS. 10A to 10D, may be included in step S2 illustrated in FIG. 7 or step S12 illustrated in FIG. 8. For convenience of description, the same components as those illustrated in FIGS. 9A to 9H will be represented by like reference numerals, and the detailed descriptions thereof will be omitted herein.

Figure 10A:
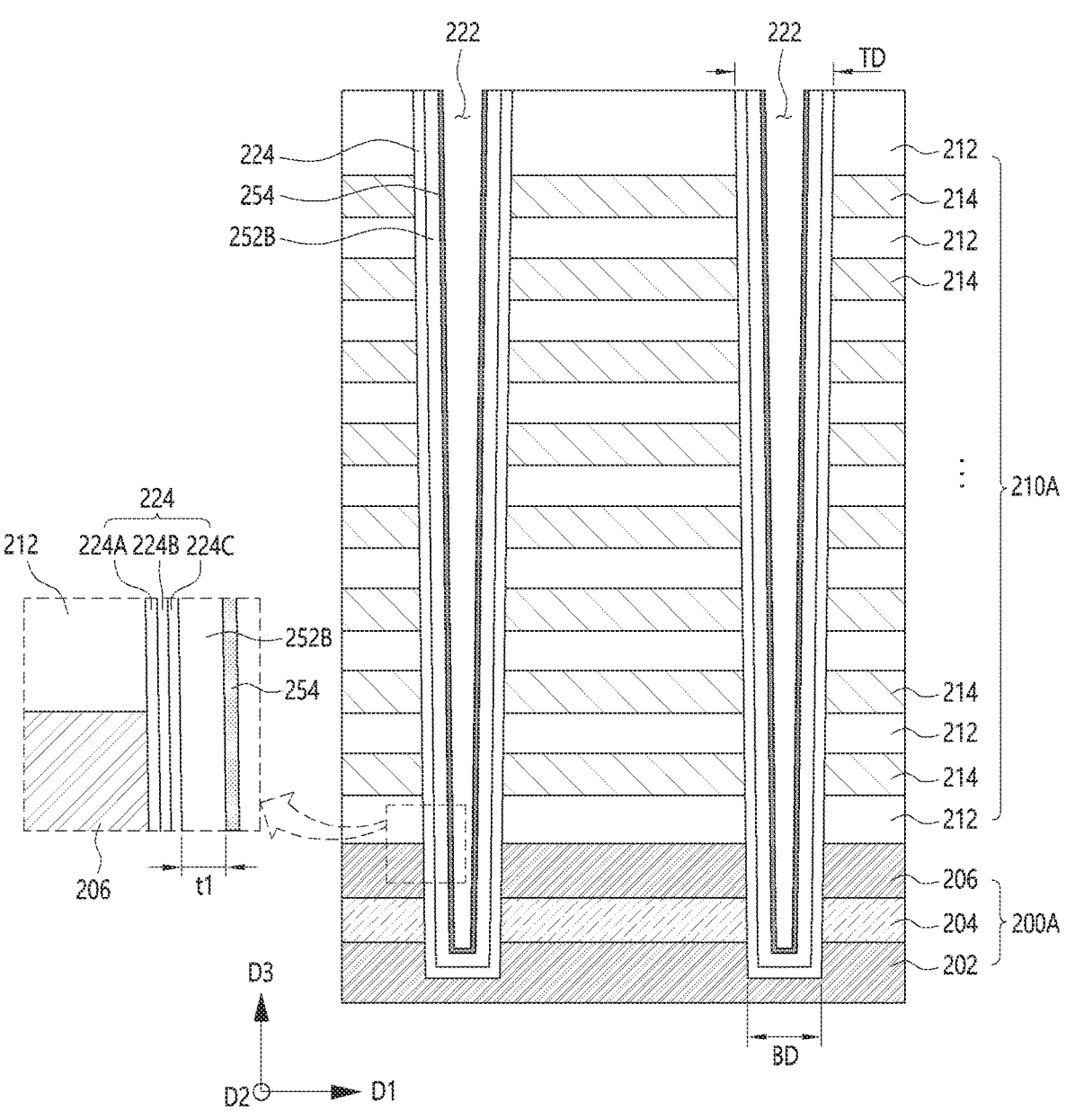
FIGS. 10A, 10B, 10C and 10D are cross-sectional views illustrating a method for fabricating a semiconductor memory device in accordance with an embodiment.

As illustrated in FIG. 10A, a stacked body 210A is formed on a pre-source layer 200A, the stacked body 210A including a plurality of interlayer dielectric layers 212 and a plurality of gate sacrificial layers 214, which are alternately stacked therein. Then, the stacked body 210A and the pre-source layer 200A may be selectively etched to form a plurality of channel holes 222. Subsequently, a memory layer 224 is formed along the surface of each of the channel holes 222.

Since the pre-source layer formation process, the stacked body formation process, the channel hole formation process and the memory layer formation process are performed in substantially the same manner as those described with reference to FIG. 9A, the detailed descriptions thereof will be omitted herein.

Then, a semiconductor layer 252B having a first thickness t1 is formed on the memory layer 224 along the surface of each of the channel holes 222. The semiconductor layer 252B may have a cylinder shape. The semiconductor layer 252B may have an amorphous state or polycrystalline state, and include silicon. For example, the semiconductor layer 252B may be formed of a polycrystalline silicon layer. The first thickness t1 may range from 100 Å to 200 Å.

Then, a crystallization support layer 254 is formed on the semiconductor layer 252B. The crystallization support layer 254 may serve as a seed layer for growing grains, and thus serve to more easily increase the sizes of grains within the semiconductor layer 252B during a subsequent crystallization anneal process. To this end, the crystallization support layer 254 may be formed of a silicon-containing dielectric layer. For example, the crystallization support layer 254 may be formed of a silicon oxide layer using DCS (Dichlorosilane).

The crystallization support layer 254 may be formed at higher temperature than the crystallization anneal temperature in a subsequent process. In this case, the crystallization support layer 254 may be formed along the exposed surface of the semiconductor layer 252B. That is, the crystallization support layer 254 formed at higher temperature than the crystallization anneal temperature in the subsequent process may have a cylinder shape.

In a modified example, the crystallization support layer 254 may be formed at lower temperature than the crystallization anneal temperature in the subsequent process. In this case, the crystallization support layer 254 may be formed only on the surface of the semiconductor layer 252B at the middle and top of the channel hole 222 except the bottom of the channel hole 222. That is, the crystallization support layer 254 formed at lower temperature than the crystallization anneal temperature in the subsequent process may have a pipe shape.

Figure 10B:
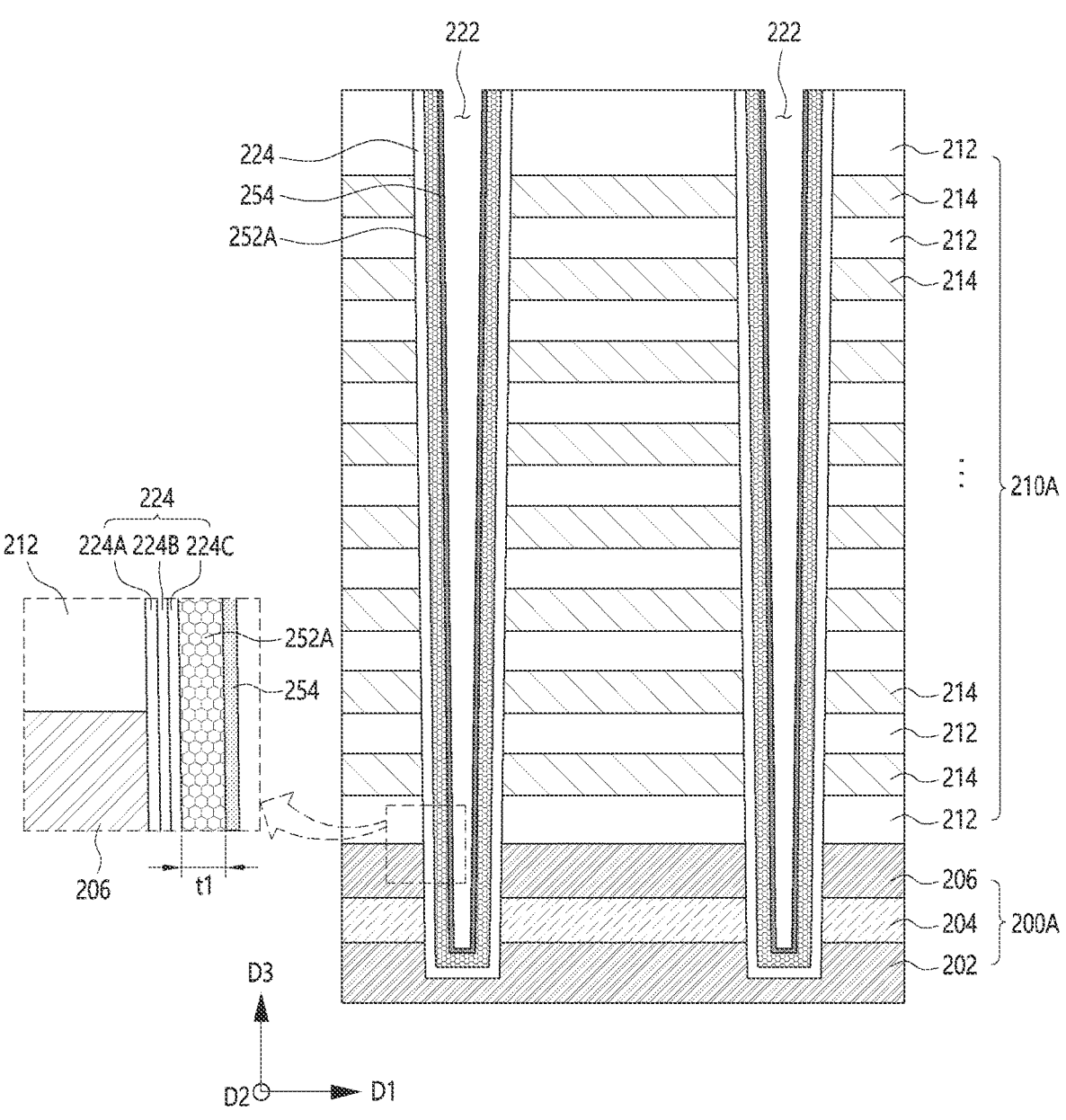

As illustrated in FIG. 10B, a crystallization anneal process for increasing the sizes of grains within the semiconductor layer 252B is performed to form a crystallized semiconductor layer 252A. The crystallization anneal process may be performed in a nitrogen atmosphere at a temperature of 400° C. to 800° C. for four to eight hours. For example, the crystallization anneal process may be performed at 600° C. At this time, the crystallization support layer 254 serves as a seed layer to grow grains at the interface between the crystallization support layer 254 and the semiconductor layer 252A. Therefore, the grains within the semiconductor layer 252A adjacent to the memory layer 224 may be formed to have a larger size than the grains within the semiconductor layer 252A adjacent to the crystallization support layer 254.

Figure 10C:
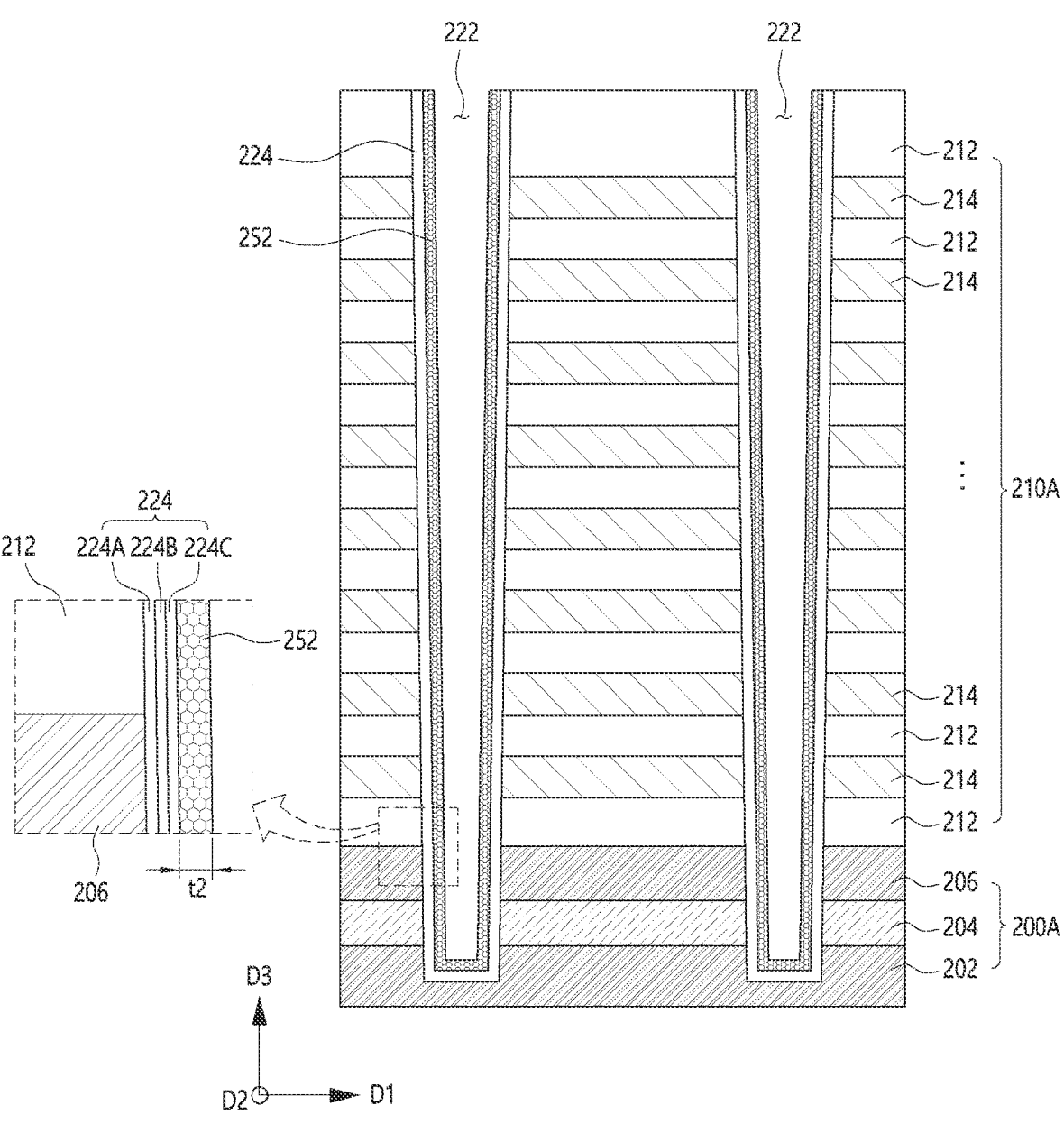

As illustrated in FIG. 10C, a channel layer 252 is formed by etching the crystallized semiconductor layer 252A to have a second thickness t2 smaller than the first thickness t1. During the etching process to form the channel layer 252, the crystallization support layer 254 may be removed with a part of the crystallized semiconductor layer 252A. At this time, isotropic wet etching or isotropic dry etching may be performed as the etching process. The second thickness t2 may be about a half of the first thickness t1. For example, when the first thickness t1 ranges from 100 Å to 200 Å, the second thickness t2 may range from 50 Å to 100 Å.

During the etching process for forming the channel layer 252, the grains having a relatively large size within the semiconductor layer 252B may remain, and the grains having a relatively small size may be removed because the grains having a relatively small size are adjacent to the crystallization support layer 254.

Figure 10D:
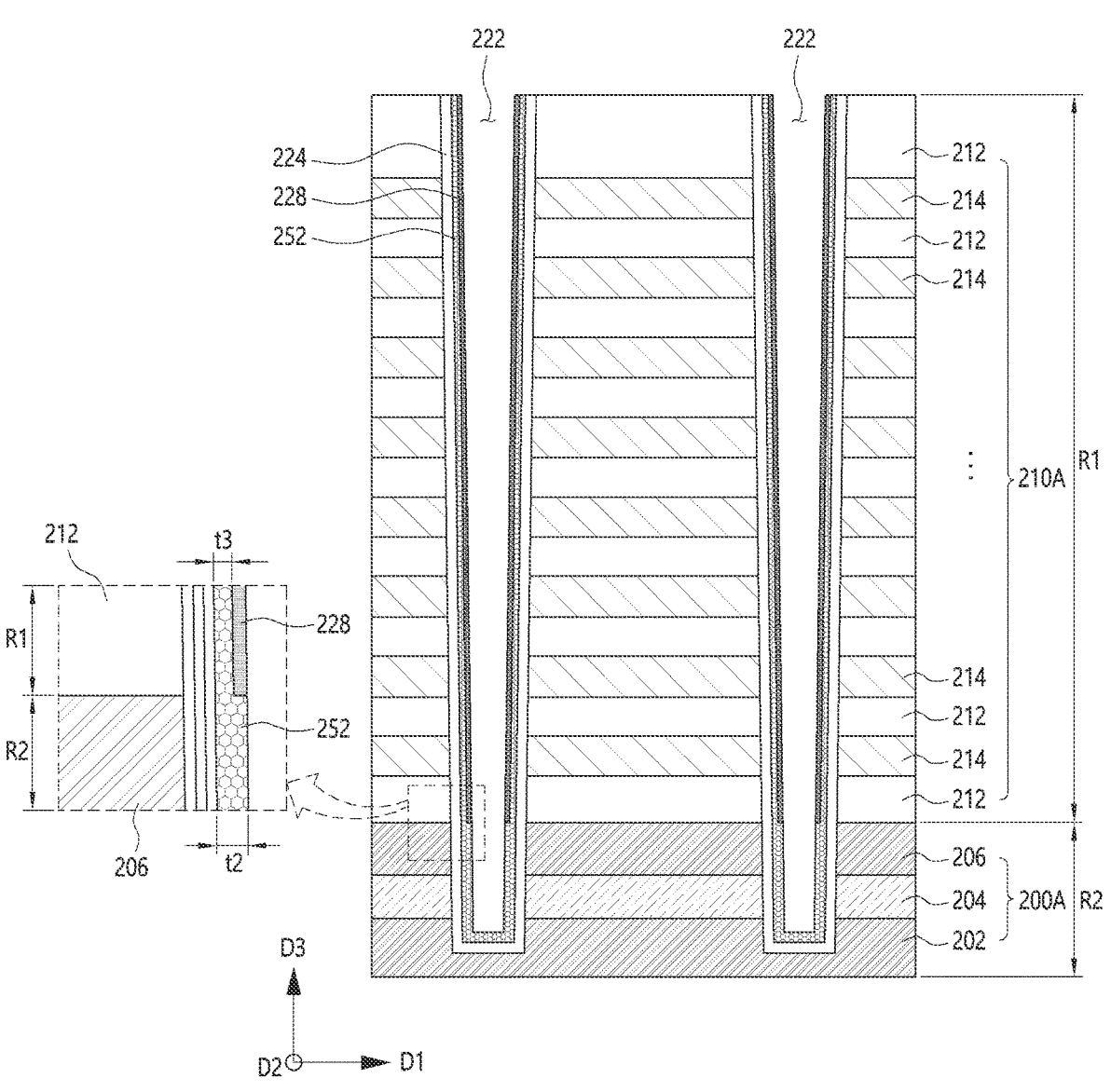

As illustrated in FIG. 10D, a channel passivation layer 228 is formed in a part of the surface of the channel layer 252. The channel passivation layer 228 may be formed of a silicon-containing dielectric layer. Specifically, the channel layer 252 may be divided into a first region R1 formed in the stacked body 210A and a second region R2 formed in the pre-source layer 200A so as to abut on the first region R1. Due to the channel passivation layer 228, the channel layer 252 of the first region R1 may have a third thickness t3 smaller than the second thickness t2. For example, when the second thickness t2 ranges from 50 Å to 100 Å, the third thickness t3 may range from 40 Å to 90 Å.

The channel passivation layer 228 may serve to stably scale down the thickness of the channel layer 252, and remove surface defects such as pinholes by covering a grain boundary exposed to the surface of the channel layer 252. To this end, the channel passivation layer 228 may be formed through radial oxidation at higher temperature than the crystallization anneal temperature. That is, the channel passivation layer 228 may be formed by oxidizing a part of the channel layer 252. For example, when the channel layer 252 is formed of a polycrystalline silicon layer, the channel passivation layer 228 may be formed by oxidizing the surface of the channel layer 252 using a large quantity of oxygen radicals generated from a process gas in which a hydrogen gas and an oxygen gas are mixed. At this time, in order to easily produce a large quantity of oxygen radicals and to uniformly form the channel passivation layer 228 in the first region R1 of the channel layer 252, the radical oxidation may be performed at a temperature of 600° ° C. to 800° C. and a pressure of 0.1 torr to 1 torr.

The subsequent processes may be performed in the same manner as described with reference to FIGS. 9E to 9H.

FIGS. 11A to 11G are cross-sectional views illustrating a method for fabricating a semiconductor memory device in accordance with an embodiment. FIGS. 11A to 11G are cross-sectional views illustrating a method for fabricating a memory cell array of a semiconductor memory device. Hereafter, the method for fabricating a memory cell array, which will be described below with reference to FIGS. 11A to 11G, may be included in step S2 illustrated in FIG. 7 or step S12 illustrated in FIG. 8. For convenience of description, the same components as those illustrated in FIGS. 9A to 9H will be represented by like reference numerals, and the detailed descriptions thereof will be omitted herein.

Figure 11A:
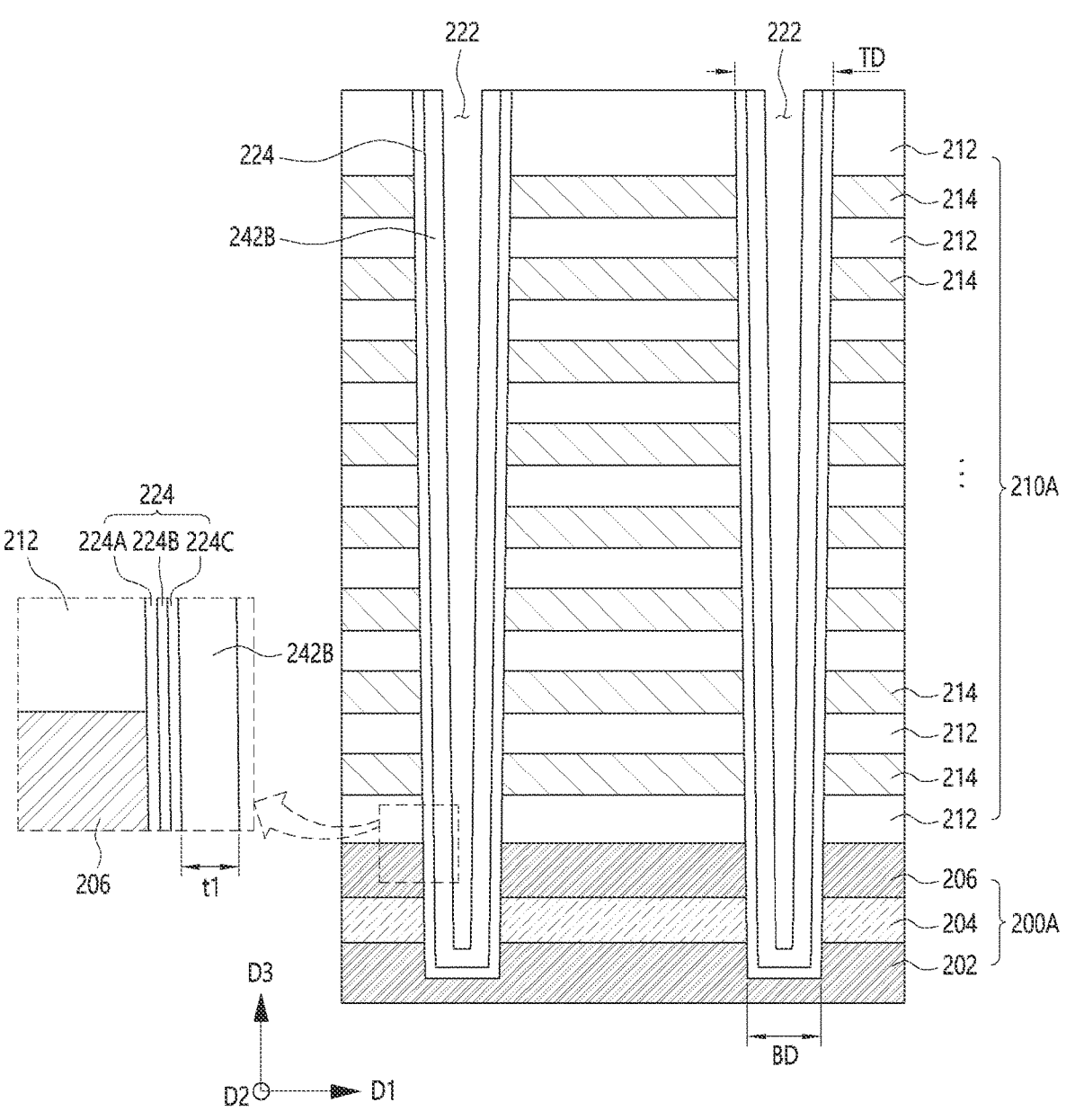
FIGS. 11A, 11B, 11C, 11D, 11E, 11F and 11G are cross-sectional views illustrating a method for fabricating a semiconductor memory device in accordance with an embodiment.

As illustrated in FIG. 11A, a stacked body 210A is formed on a pre-source layer 200A, the stacked body 210A including a plurality of interlayer dielectric layers 212 and a plurality of gate sacrificial layers 214, which are alternately stacked therein. Then, the stacked body 210A and the pre-source layer 200A may be selectively etched to form a plurality of channel holes 222. Subsequently, a memory layer 224 is formed along the surface of each of the channel holes 222.

Since the pre-source layer formation process, the stacked body formation process, the channel hole formation process and the memory layer formation process are performed in substantially the same manner as described with reference to FIG. 9A, the detailed descriptions thereof will be omitted herein.

Then, a first semiconductor layer 242B having a first thickness t1 is formed on the memory layer 224 along the surface of each of the channel holes 222. The first semiconductor layer 242B may have a cylinder shape. The first semiconductor layer 242B may have an amorphous state or polycrystalline state, and include silicon. For example, the first semiconductor layer 242B may be formed of a polycrystalline silicon layer.

Although not illustrated in the drawings, a first crystallization support layer may be formed on the first semiconductor layer 242B. The first crystallization support layer may be formed of a silicon-containing dielectric layer. The first crystallization support layer may be formed in the same manner as the crystallization support layer 254 described with reference to FIG. 10A.

Figure 11B:
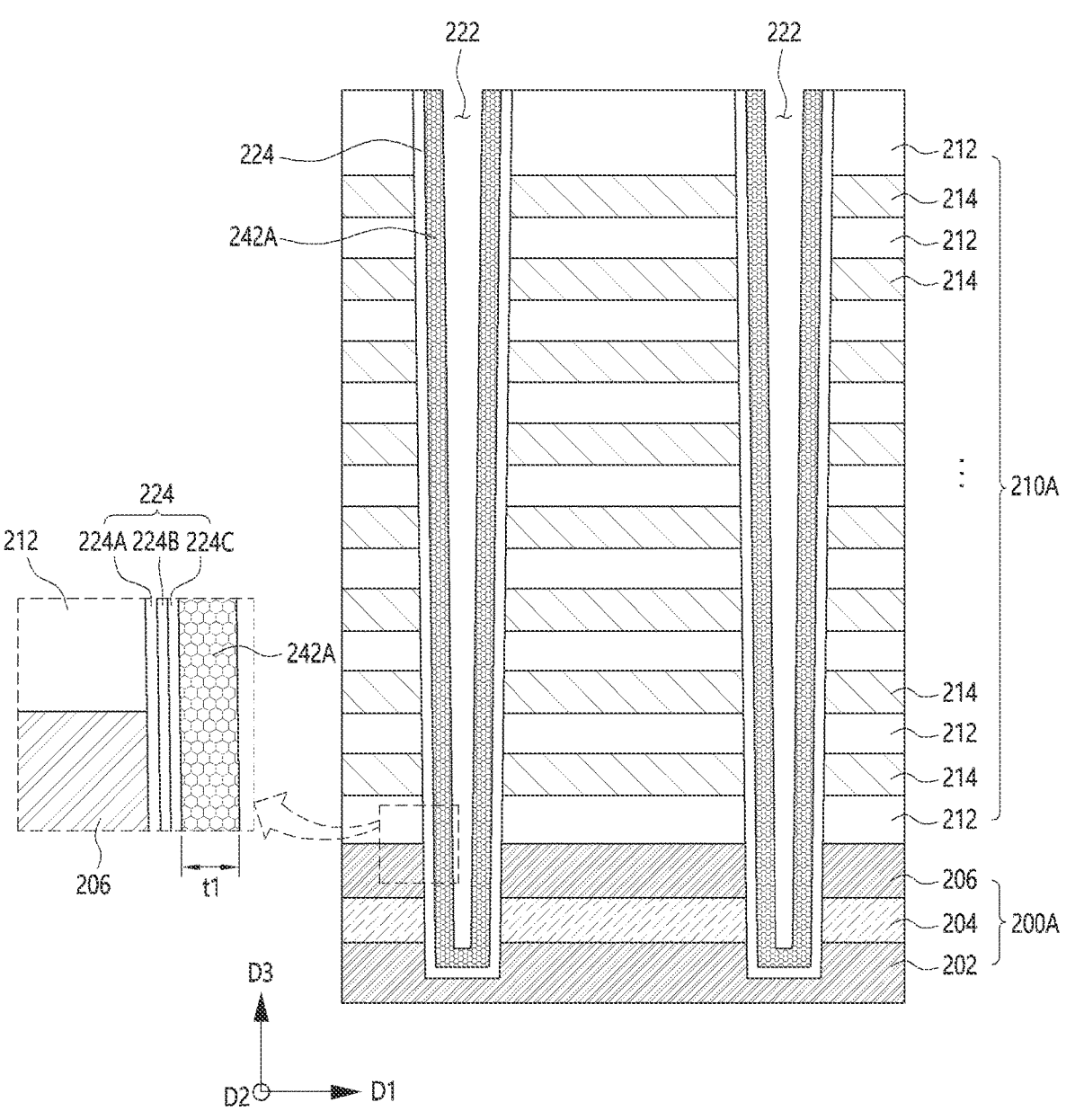

As illustrated in FIG. 11B, a first crystallization anneal process for increasing the sizes of grains within the first semiconductor layer 242B is performed to form a crystallized first semiconductor layer 242A. The first crystallization anneal process may be performed in a nitrogen atmosphere at a temperature of 400° C. to 800° C. for four to eight hours. For example, the first crystallization anneal process may be performed at 600° C.

Figure 11C:
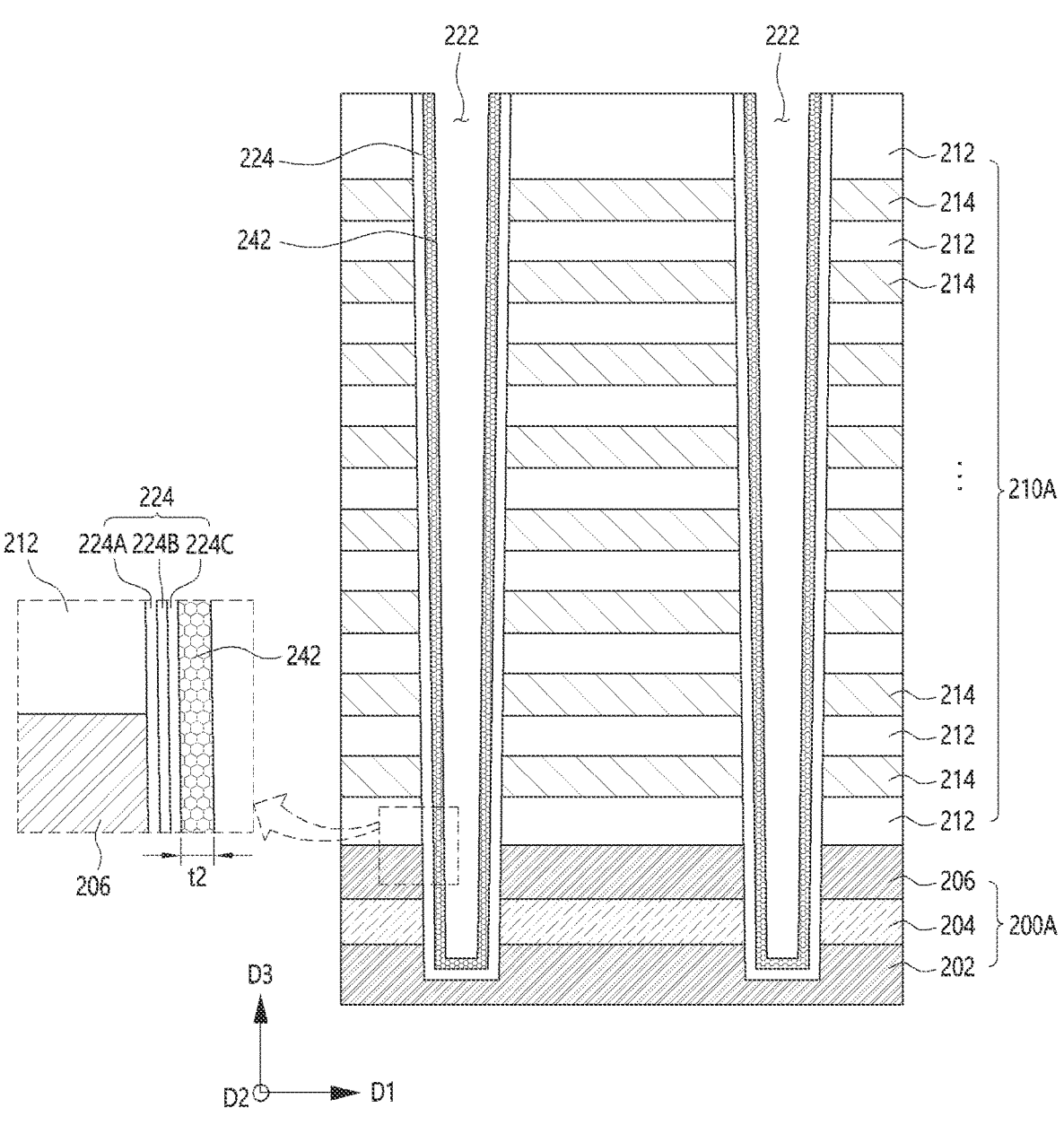

As illustrated in FIG. 11C, a first thin film 242 is formed by etching the crystallized first semiconductor layer 242A to have a second thickness t2 smaller than the first thickness t1. As the etching process, isotropic wet etching or isotropic dry etching may be performed.

Figure 11D:
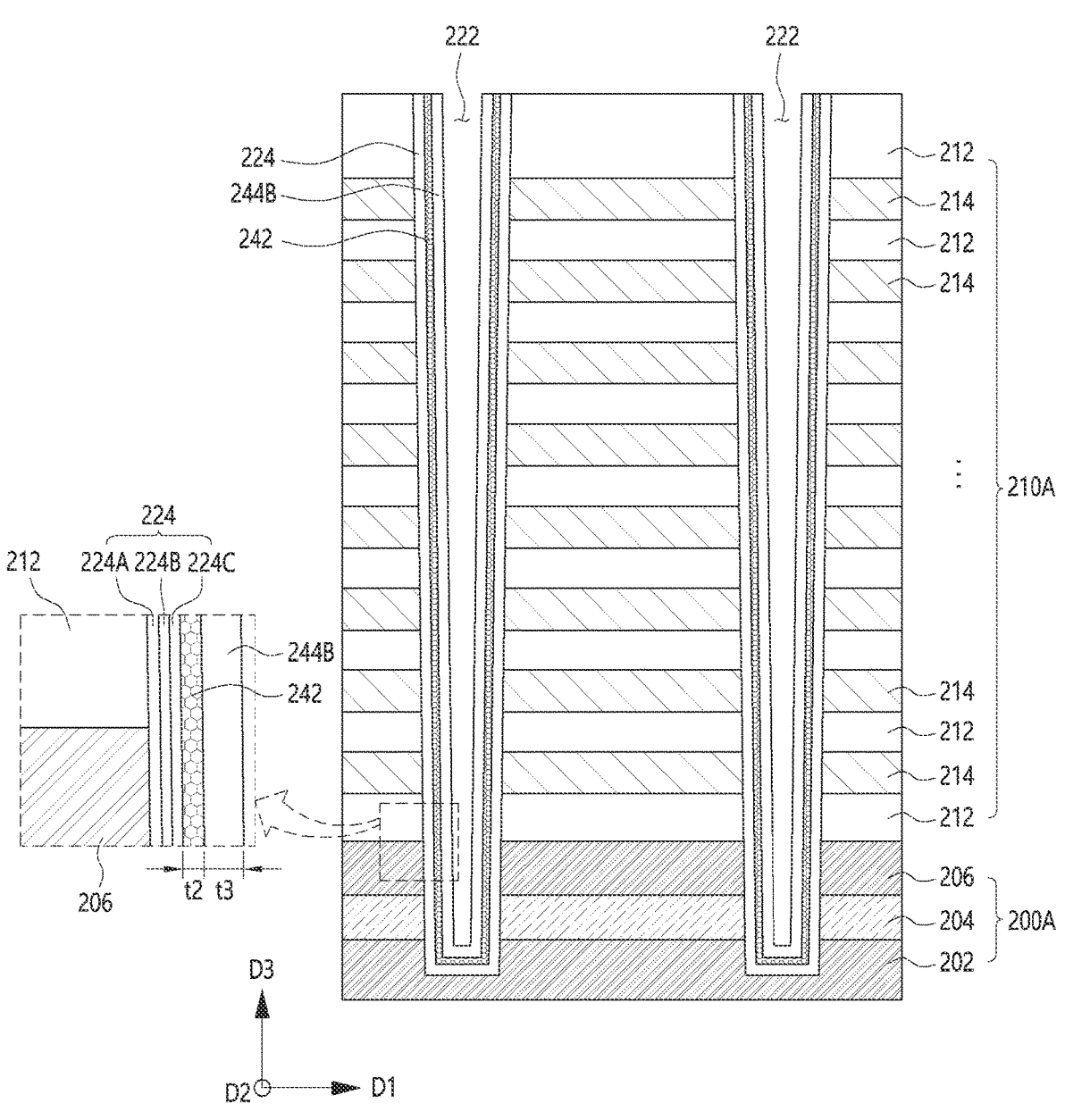

As illustrated in FIG. 11D, a second semiconductor layer 244B having a third thickness t3 is formed on the first thin film 242 along the surface of each of the channel holes 222. The second semiconductor layer 244B may have a cylinder shape. The second semiconductor layer 244B may have an amorphous state or polycrystalline state, and include silicon. For example, the second semiconductor layer 244B may be formed of a polycrystalline silicon layer.

Although not illustrated in the drawings, a second crystallization support layer may be formed on the second semiconductor layer 244B. The second crystallization support layer may be formed of a silicon-containing dielectric layer. The second crystallization support layer may be formed in the same manner as the crystallization support layer 254 described with reference to FIG. 10A.

Figure 11E:
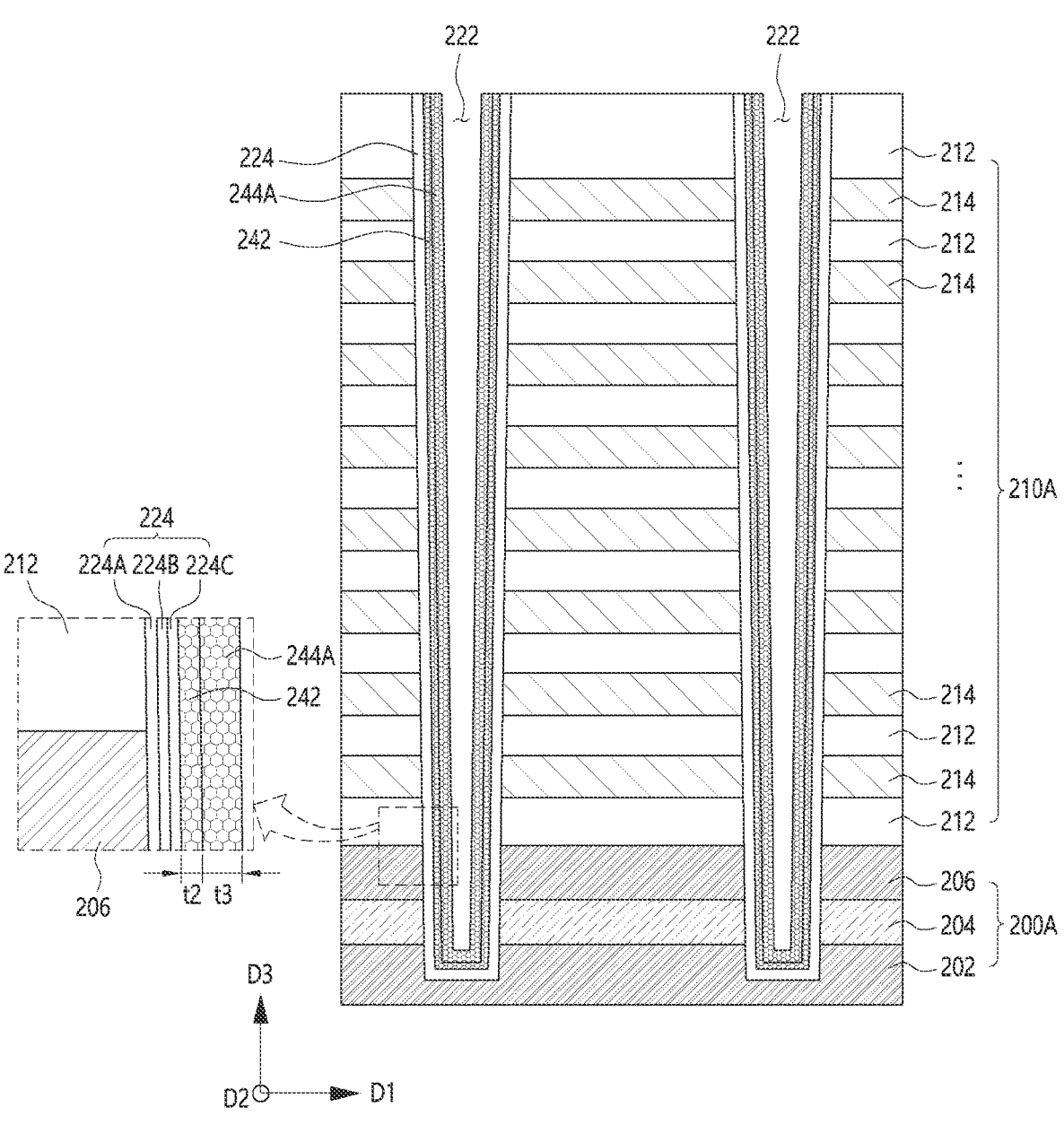

As illustrated in FIG. 11E, a second crystallization anneal process for increasing the sizes of grains within the second semiconductor layer 244B is performed to form a crystallized second semiconductor layer 244A. The second crystallization anneal process may be performed in a nitrogen atmosphere at a temperature of 400° C. to 800° C. for four to eight hours. For example, the second crystallization anneal process may be performed at 600° C.

During the second crystallization anneal process, the crystallized first thin film 242 may serve as a seed layer to grow grains within the second semiconductor layer 244A, which makes it possible to more effectively increase the sizes of the grains. Furthermore, it is possible to further increase the sizes of the grains within the first thin film 242 during the second crystallization anneal process.

Figure 11F:
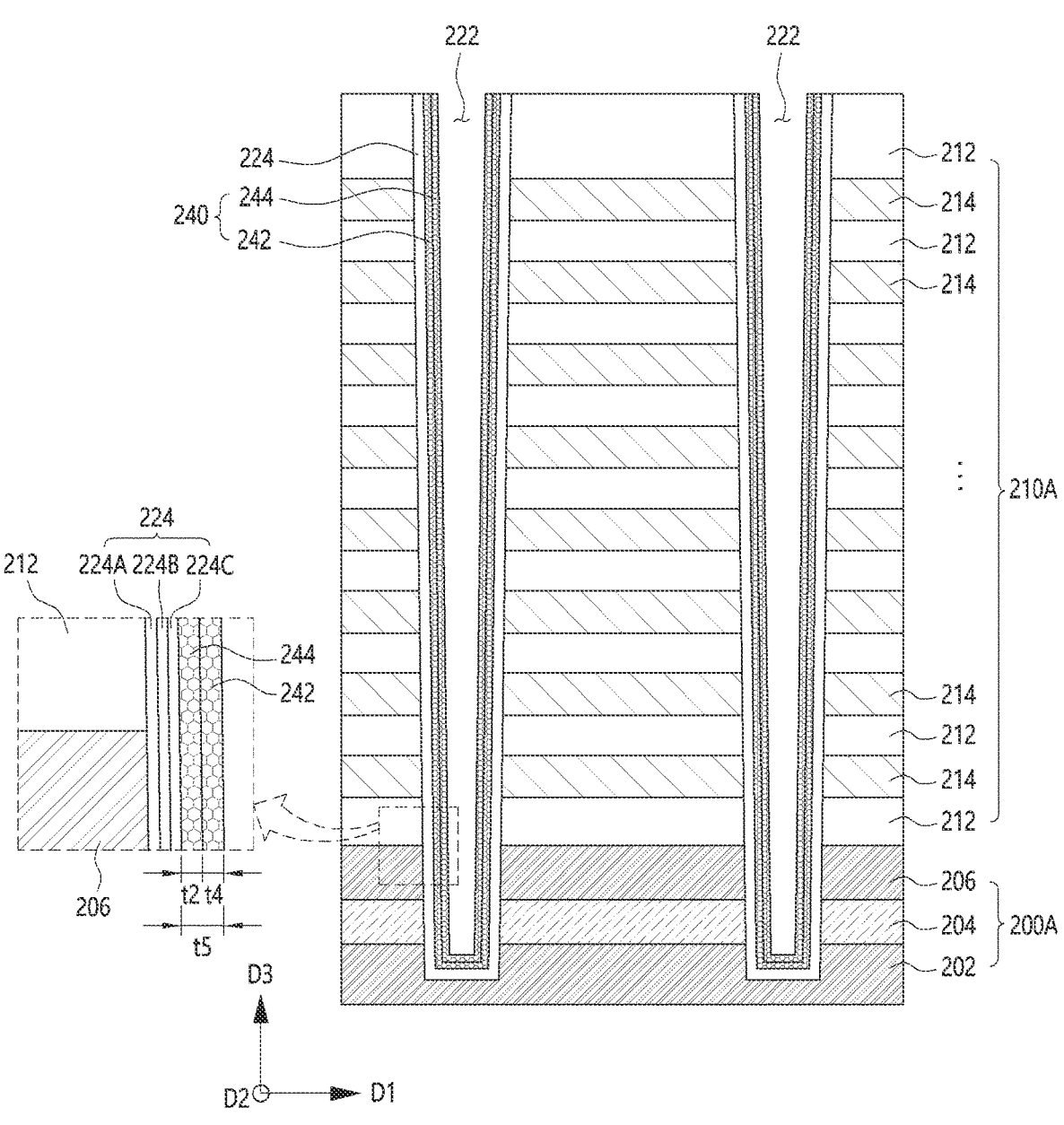

As illustrated in FIG. 11F, a second thin film 244 is formed by etching the crystallized second semiconductor layer 244A to have a fourth thickness t4 smaller than the third thickness t3. As the etching process, isotropic wet etching or isotropic dry etching may be performed.

In this way, a channel layer 240 in which the first thin film 242 having the second thickness t2 and the second thin film 244 having the fourth thickness t4 are stacked may be formed. The channel layer 240 may have a fifth thickness t5 corresponding to the sum of the second and fourth thicknesses t2 and t4.

In an embodiment, the case in which the channel layer 240 is formed by repeatedly performing the semiconductor layer deposition process, the crystallization anneal process and the etching process two times is taken as an example. However, the embodiment is not limited thereto. In a modified example, the channel layer 240 may be formed by repeatedly performing the semiconductor layer deposition process, the crystallization anneal process and the etching process two or more times.

Figure 11G:
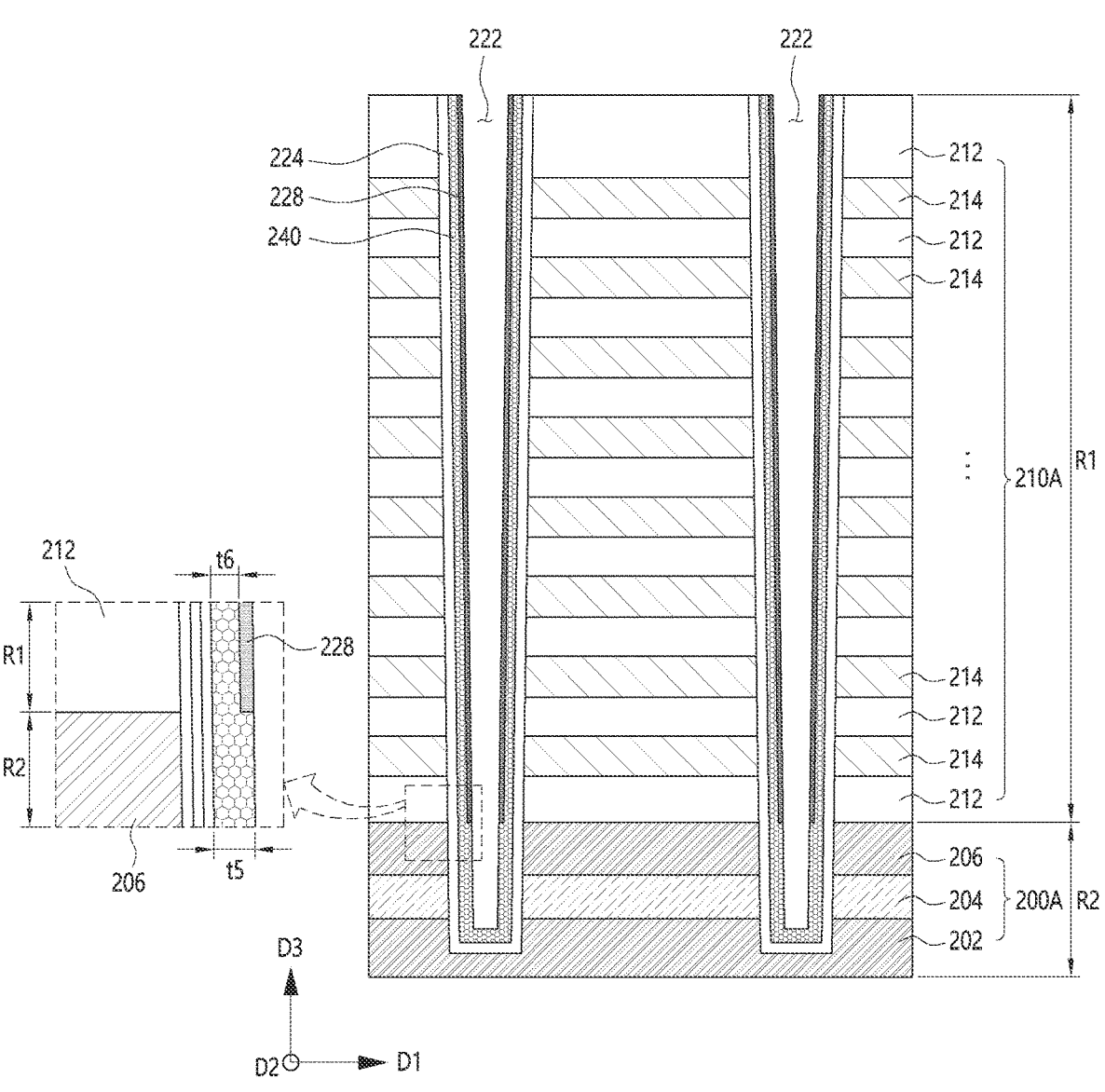

As illustrated in FIG. 11G, a channel passivation layer 228 is formed in a part of the surface of the channel layer 240. Specifically, the channel layer 240 may be divided into a first region R1 formed in the stacked body 210A and a second region R2 formed in the pre-source layer 200A so as to abut on the first region R1. Due to the channel passivation layer 228, the channel layer 240 of the first region R1 may have a sixth thickness t6 smaller than the fifth thickness t5. The channel passivation layer 228 may be formed of a silicon-containing dielectric layer.

The channel passivation layer 228 may serve to stably scale down the thickness of the channel layer 240, and remove surface defects such as pinholes by covering a grain boundary exposed to the surface of the channel layer 240. To this end, the channel passivation layer 228 may be formed through radial oxidation at higher temperature than the crystallization anneal temperature. That is, the channel passivation layer 228 may be formed by oxidizing a part of the channel layer 240. For example, when the channel layer 240 is formed of a polycrystalline silicon layer, the channel passivation layer 228 may be formed by oxidizing the surface of the channel layer 240 using a large quantity of oxygen radicals generated from a process gas in which a hydrogen gas and an oxygen gas are mixed. At this time, in order to easily produce a large quantity of oxygen radicals and to uniformly form the channel passivation layer 228 in the first region R1 of the channel layer 240, the radical oxidation may be performed at a temperature of 600° C. to 800° C. and a pressure of 0.1 torr to 1 torr.

The subsequent processes may be performed in the same manner as described with reference to FIGS. 9E to 9H.

FIG. 12 is a block diagram illustrating a configuration of a memory system in accordance with an embodiment.

As illustrated in FIG. 12, the memory system 1100 includes a memory device 1120 and a memory controller 1110.

The memory device 1120 may include a gate stack and a plurality of channel structures. The gate stack may be formed on a source layer and include a plurality of interlayer dielectric layers and a plurality of gate conductive layers, which are alternately stacked therein, and the plurality of channel structures may be formed through the gate stack, and each have a lower end extended into the source layer. Each of the channel structures may include a channel layer and a channel passivation layer. The channel layer may have a first region formed in the gate stack and a second region formed in the source layer so as to abut on the first region, and the channel passivation layer may be formed in the first region of the channel layer. The channel layer of the first region may have a small thickness than the channel layer of the second region. The channel passivation layer included in the memory device 1120 may improve the operation reliability of the memory device 1120.

The memory device 1120 may be a multi-chip package constituted by a plurality of flash memory chips.

The memory controller 1110 may be configured to control the memory device 1120, and include an SRAM (Static Random Access Memory) 1111, a CPU (Central Processing Unit) 1112, a host interface 1113, an error correction block 1114 and a memory interface 1115. The SRAM 1111 may be used as a working memory of the CPU 1112, the CPU 1112 may perform overall control operations for data exchange of the memory controller 1110, and the host interface 1113 may include a data exchange protocol of a host connected to the memory system 1100. The error correction block 1114 may detect and correct an error contained in data read from the memory device 1120, and the memory interface 1115 may interface with the memory device 1120. In addition, the memory controller 1110 may further include a ROM (Read Only Memory) configured to store code data for interfacing with the host.

Figure 13:
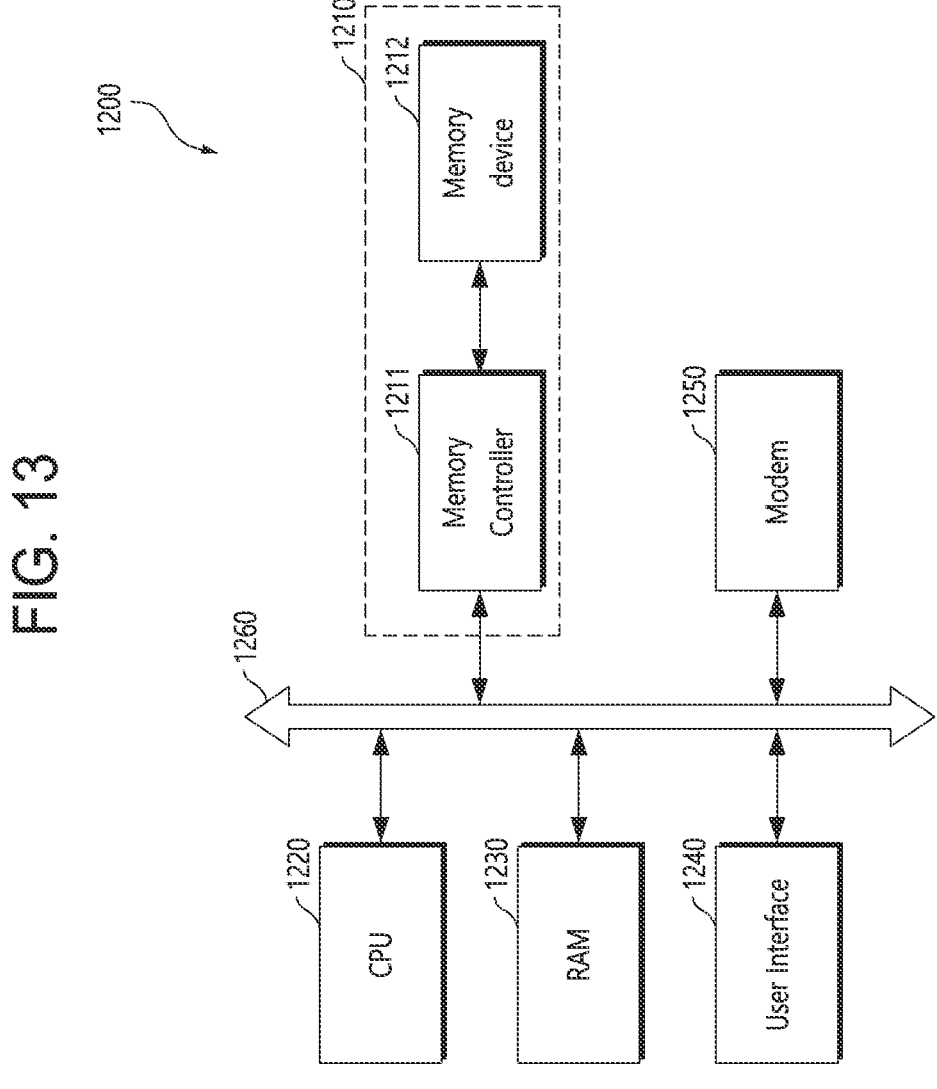
FIG. 13 is a block diagram illustrating a configuration of a computing system in accordance with an embodiment.

FIG. 13 is a block diagram illustrating a configuration of a computing system in accordance with an embodiment.

As illustrated in FIG. 13, a computing system 1200 may include a CPU 1220, a RAM (Random Access Memory) 1230, a user interface 1240, a modem 1250 and a memory system 1210, which are electrically connected to a system bus 1260. The computing system 1200 may be a mobile device.

The memory system 1210 may include a memory device 1212 and a memory controller 1211. The memory device 1212 may include a gate stack and a plurality of channel structures. The gate stack may be formed on a source layer and include a plurality of interlayer dielectric layers and a plurality of gate conductive layers, which are alternately stacked therein, and the plurality of channel structures may be formed through the gate stack, and each have a lower end extended into the source layer. Each of the channel structures may include a channel layer and a channel passivation layer. The channel layer may have a first region formed in the gate stack and a second region formed in the source layer so as to abut on the first region, and the channel passivation layer may be formed in the first region of the channel layer. The channel layer of the first region may have a smaller thickness than the channel layer of the second region. The channel passivation layer included in the memory device 1212 may improve the operation reliability of the memory device 1212.

While various embodiments have been described above, it will be understood to those skilled in the art that the embodiments described are examples only. Accordingly, the semiconductor memory device and the fabrication method, which have been described herein, should not be limited based on the described embodiments.

What is claimed is:

1. A method for fabricating a semiconductor memory device, the method comprising the steps of:
   forming a stacked body on a source layer by alternately stacking a plurality of interlayer dielectric layers and a plurality of gate sacrificial layers;
   forming a plurality of channel holes through the stacked body, the channel holes each having a lower end extended into the source layer;
   forming a channel layer along the surfaces of the channel holes, the channel layer including a first region formed in the stacked body and a second region formed in the source layer;
   forming a sacrificial layer on the channel layer of the second region;
   forming a channel passivation layer in the first region to scale down the thickness of the channel layer of the first region; and
   removing the sacrificial layer after the channel passivation layer is formed.

2. The method according to claim 1, further comprising the step of forming a memory layer on side and bottom surfaces of the channel holes before forming the semiconductor layer, wherein the memory layer is formed as a stacked layer in which a blocking layer, a charge trap layer and a tunnel dielectric layer are stacked.

3. The method according to claim 1, further comprising the steps of:
   forming a core pillar on the channel passivation layer and the channel layer after forming the channel passivation layer, such that the core pillar gap-fills the channel hole;
   forming a recess by etching the top of the core pillar;
   expanding the recess by etching the channel passivation layer exposed to a side surface of the recess; and
   forming a capping layer which gap-fills the expanded recess and is electrically coupled to the channel layer.

4. The method according to claim 1, wherein forming the channel layer comprises:
   forming a semiconductor layer along the surfaces of the channel holes, the semiconductor layer having a first thickness;
   forming a crystallized semiconductor layer by performing a crystallization anneal process; and
   etching the crystallized semiconductor layer to have a second thickness smaller than the first thickness,
   wherein the forming of the semiconductor layer, the crystallization anneal process and the etching are repeatedly performed one or more times.

5. The method according to claim 4, further comprising forming a crystallization support layer on the semiconductor layer before performing the crystallization anneal process, wherein the crystallization support layer is removed in the step of etching the crystallized semiconductor layer to have the second thickness.

6. The method according to claim 5, wherein the semiconductor layer comprises an amorphous silicon layer or a polycrystalline silicon layer, and the crystallization support layer comprises a silicon-containing dielectric layer.

7. The method according to claim 1, wherein the channel passivation layer is formed by selectively oxidizing the surface of the channel layer of the first region through radical oxidation in the first region.

8. The method according to claim 7, wherein the channel layer includes a polycrystalline silicon layer, and the channel passivation layer includes a silicon oxide layer.

9. The method according to claim 1, wherein the channel passivation layer is formed through radical oxidation using oxygen radicals generated from a process gas in which a hydrogen gas and an oxygen gas are mixed, and formed at a temperature of 600° C. to 800° C. and a pressure of 0.1 torr to 1 torr.

10. The method according to claim 1, wherein the channel layer of the first region has a smaller thickness than the channel layer of the second region, after the channel passivation layer is formed.

11. The method according to claim 1, wherein the channel layer has a cylinder shape, the channel layer of the first region has a pipe shape, the channel layer of the second region has a cylinder shape, and the channel passivation layer has a pipe shape.

12. The method according to claim 1, wherein each of the channel holes has an inclined sidewall, and has a trapezoid-type cross-sectional shape whose top entrance has a larger line width than a bottom surface of the trapezoid-type cross-sectional shape.

13. The method of claim 1, further comprising, before forming the passivation layer, forming a sacrificial layer to gap-fill the bottom of the channel hole, forming the passivation layer, and then removing the sacrificial layer.

14. A method for fabricating a semiconductor memory device, the method comprising the steps of:

forming a stacked body including a first region and a second region formed under the first region;

forming at least one channel hole in the stacked body;

forming a channel layer along inner surfaces of the channel hole to have a first set thickness; and selectively shrinking the channel layer of the first region to have a second set thickness thinner than the first set thickness, wherein the second region includes at least one source layer contacted to the channel layer having the first set thickness.

15. The method according to claim 14, wherein the step of the shrinking the channel layer of the first region comprises forming a channel passivation layer on the channel layer of the first region.

16. The method according to claim 15, wherein the channel passivation layer is formed by selectively oxidizing a set thickness of the channel layer of the first region.

17. The method according to claim 16, wherein the channel passivation layer is formed through a radical oxidation using oxygen radicals generated from a process gas in which a hydrogen gas and an oxygen gas are mixed, and formed at a temperature of 600° C. to 800° C. and a pressure of 0.1 torr to 1 torr.

18. The method according to claim 14, further comprising:

forming a memory layer along the inner surface of the channel hole before forming the channel layer.

19. The method according to claim 14, wherein the first region is formed by alternately stacking a plurality of interlayer dielectric layers and a plurality of gate sacrificial layers.

* * * * *